United States Patent
Noda et al.

(10) Patent No.: US 7,480,496 B2
(45) Date of Patent: Jan. 20, 2009

(54) HIGH-FREQUENCY RECEIVER AND PORTABLE DEVICE USING THE SAME

(75) Inventors: Masaaki Noda, Gifu (JP); Atsuhito Terao, Gifu (JP); Sanae Asayama, Aichi (JP)

(73) Assignee: Panasonic Corporation, Osaka (JP)

( * ) Notice: Subject to any disclaimer, the term of this patent is extended or adjusted under 35 U.S.C. 154(b) by 555 days.

(21) Appl. No.: 11/203,133

(22) Filed: Aug. 15, 2005

(65) Prior Publication Data

US 2006/0046678 A1    Mar. 2, 2006

(30) Foreign Application Priority Data

Aug. 27, 2004   (JP)   ............... 2004-248055

(51) Int. Cl.
*G06F 3/033*   (2006.01)

(52) U.S. Cl. .................. 455/130; 455/285; 455/296; 455/297; 455/302

(58) Field of Classification Search ............ 455/130
See application file for complete search history.

(56) References Cited

U.S. PATENT DOCUMENTS

2006/0222058 A1 *   10/2006   Simic et al. ................. 375/150

FOREIGN PATENT DOCUMENTS

| EP | 1 184 970 A2 | 3/2002 |
| EP | 1 195 899 A2 | 4/2002 |
| EP | 1 416 642 A2 | 5/2004 |
| EP | 1416642 A2 * | 5/2004 |
| FR | 2 828 599 | 2/2003 |
| JP | 01-265688 | 10/1989 |
| JP | 2000-295539 A | 10/2000 |
| JP | 2002-118795 A | 4/2002 |
| JP | 2004-179841 A | 6/2004 |

* cited by examiner

*Primary Examiner*—Yuwen Pan
*Assistant Examiner*—Ajibola Akinyemi
(74) *Attorney, Agent, or Firm*—McDermott Will & Emery LLP

(57) ABSTRACT

A high-frequency receiver and a portable device using the same receiver are proposed for reducing power consumption. Image interference determiner (44) determines whether or not image interference exists at the present position in a desirable channel to be received, which channel is obtained by a receiving section (39) or a GPS receiver (43). Power supply control circuit (47) switches mixer (49) from an image rejection mixer to a double balance mixer when determiner (44) determines no image interference involves. This mechanism allows mixer (49) to work as the double balance mixer circuit during the reception of channels free from image interference, so that a mixer consuming less power is achievable. When mixer (49) works as the image rejection mixer circuit, image interference can be reduced.

5 Claims, 18 Drawing Sheets

FIG. 6B

| Operating mode | Reception band | Mixer Form | Phase shifter, Frequency divider | | Mixer | | | Phase shifter | Switch | |
|---|---|---|---|---|---|---|---|---|---|---|
| | | | 201 | 205 | 49a | 49b | 55 | 49c | 204 | 67 |
| Power saving mode | VL | DBM | ON | ON | ON | OFF | OFF | OFF | 204b | 67c |
| | VH | DBM | ON | OFF | ON | OFF | OFF | OFF | - | 67b |
| Regular mode | VL | IRM | ON | ON | ON | ON | OFF | ON | 204b | 67c |
| | VH | IRM | ON | OFF | ON | ON | OFF | ON | 204a | 67b |
| | UHF | DBM | OFF | OFF | OFF | OFF | ON | OFF | - | 67a |

FIG. 7B

| Operating mode | Reception band | Mixer Form | Phase shifter, Frequency divider | | Vector Synthesizer | Limiting circuit | Mixer | | |
|---|---|---|---|---|---|---|---|---|---|
| | | | 201 | 205 | 202,203 | 206,207 | 49a | 49b | 55 |
| Power saving mode | VL | DBM | ON | ON | OFF | OFF | ON | OFF | OFF |
| | VH | DBM | ON | OFF | OFF | OFF | ON | OFF | OFF |
| Midle mode | VL | IRM | ON | ON | OFF | OFF | ON | ON | OFF |
| | VH | IRM | ON | OFF | OFF | OFF | ON | ON | OFF |
| Regular mode | VL | IRM | ON | ON | ON | ON | ON | ON | OFF |
| | VH | IRM | ON | OFF | ON | ON | ON | ON | OFF |
| | UHF | DBM | OFF | OFF | OFF | OFF | OFF | OFF | ON |

| Operating mode | Phase shifter | Reception band | Mixer Form | Switch | | | |
|---|---|---|---|---|---|---|---|
| | 49c | | | 204 | 67 | 208 | 209 |
| Power saving mode | OFF | VL | DBM | 204b | 67c | 208b | - |
| | OFF | VH | DBM | - | 67b | 208b | - |
| Midle mode | OFF | VL | IRM | 204b | 67c | 208b | 209b |
| | OFF | VH | IRM | - | 67b | 208b | 209b |
| Regular mode | ON | VL | IRM | 204b | 67c | 208a | 209a |
| | ON | VH | IRM | 204a | 67b | 208a | 209a |
| | OFF | UHF | DBM | - | 67a | - | - |

FIG. 9B

| Operating mode | Reception band | Mixer Form | Phase shifter, Frequency divider | | | Vector Synthesizer | Limiting circuit | Mixer | | | |
|---|---|---|---|---|---|---|---|---|---|---|---|
| | | | 201 | 205 | 402 | 202, 203 | 206, 207 | 365a | 365b | 355a | 355b |
| Power saving mode | VL | DBM | ON | ON | ON | OFF | OFF | ON | OFF | OFF | OFF |
| Regular mode | VL | IRM | ON | ON | ON | ON | ON | ON | ON | OFF | OFF |
| | VH | IRM | ON | OFF | ON | ON | ON | ON | ON | OFF | OFF |
| | UHF | IRM | OFF | OFF | ON | ON | ON | OFF | OFF | ON | ON |

| Operating mode | Reception band | Mixer Form | Phase shifter | | Switch | | | |
|---|---|---|---|---|---|---|---|---|
| | | | 365c | 355c | 204 | 67 | 401 | 403 |
| Power saving mode | VL | DBM | OFF | OFF | 204b | 67c | 401b | 403b |
| Regular mode | VL | IRM | ON | OFF | 204b | 67c | 401b | 403a |
| | VH | IRM | ON | OFF | 204a | 67b | 401b | 403a |
| | UHF | IRM | OFF | ON | - | 67a | 401a | 403a |

FIG. 11B

| Operating mode | Reception band | Mixer Form | Phase shifter, Frequency divider | | | Vector synthesizer | | | Limiting circuit | | |
|---|---|---|---|---|---|---|---|---|---|---|---|
| | | | 201 | 601 | 602 | 202, 203 | 603, 604 | 605, 606 | 206, 207 | 607, 608 | 609, 610 |
| Power saving mode | VL | DBM | ON | OFF | ON | OFF | OFF | OFF | OFF | OFF | OFF |
| | VH | DBM | ON | OFF | OFF | OFF | OFF | OFF | OFF | OFF | OFF |
| Regular mode | VL | IRM | ON | OFF | ON | OFF | OFF | ON | OFF | OFF | ON |
| | VH | IRM | ON | OFF | OFF | ON | OFF | OFF | ON | OFF | OFF |
| | UHF | DBM | OFF | OFF | OFF | OFF | OFF | OFF | OFF | OFF | OFF |
| High-quality mode | VL | HRM | ON | ON | ON | OFF | ON | ON | OFF | ON | ON |

| Operating mode | Reception band | Mixer Form | Mixer | | | | | | |
|---|---|---|---|---|---|---|---|---|---|
| | | | 55 | 49a | 49b | 565d | 565f | 565h | 565j |
| Power saving mode | VL | DBM | OFF | OFF | OFF | OFF | OFF | OFF | ON |
| | VH | DBM | OFF | ON | OFF | OFF | OFF | OFF | OFF |
| Regular mode | VL | IRM | OFF | OFF | OFF | OFF | OFF | ON | ON |
| | VH | IRM | OFF | ON | ON | OFF | OFF | OFF | OFF |
| | UHF | DBM | ON | OFF | OFF | OFF | OFF | OFF | OFF |
| High-quality mode | VL | HRM | OFF | OFF | OFF | ON | ON | ON | ON |

| Operating mode | Phase shifter | | | | Switch | | |
|---|---|---|---|---|---|---|---|
| | 49c | 565e | 565g | 565i | 67 | 611 | 612 |
| Power saving mode | OFF | OFF | OFF | OFF | 67e | - | ON |
| | OFF | OFF | OFF | OFF | 67d | ON | - |
| Regular mode | OFF | OFF | OFF | ON | 67e | - | OFF |
| | ON | OFF | OFF | OFF | 37d | OFF | - |
| | OFF | OFF | OFF | OFF | 67a | - | - |
| High-quality mode | OFF | ON | ON | ON | 67e | - | OFF |

FIG. 13B

| Operating mode | Reception band | Mixer Form | Phase shifter, Frequency divider | | | Vector synthesizer | | Limiting circuit | |
|---|---|---|---|---|---|---|---|---|---|
| | | | 201 | 601 | 205 | 202, 203 | 603, 604 | 206, 207 | 607, 608 |
| Power saving mode | VL | DBM | ON | OFF | ON | OFF | OFF | OFF | OFF |
| | VH | DBM | ON | OFF | OFF | OFF | OFF | OFF | OFF |
| Regular mode | VL | IRM | ON | OFF | ON | ON | OFF | ON | OFF |
| | VH | IRM | ON | OFF | OFF | ON | OFF | ON | OFF |
| | UHF | DBM | OFF | OFF | OFF | OFF | OFF | OFF | OFF |
| High-quality mode | VL | HRM | ON | ON | ON | ON | ON | ON | ON |

| Operating mode | Mixer | | | | | Reception band | Mixer Form |
|---|---|---|---|---|---|---|---|
| | 55 | 65a | 65b | 565d | 565f | | |
| Power saving mode | OFF | ON | OFF | OFF | OFF | VL | DBM |
| | OFF | ON | OFF | OFF | OFF | VH | DBM |
| Regular mode | OFF | ON | ON | OFF | OFF | VL | IRM |
| | OFF | ON | ON | OFF | OFF | VH | IRM |
| | ON | OFF | OFF | OFF | OFF | UHF | DBM |
| High-quality mode | OFF | ON | ON | ON | ON | VL | HRM |

| Operating mode | Phase shifter | | | Switch | | | | |
|---|---|---|---|---|---|---|---|---|
| | 65c | 565e | 565g | 701 | 204 | 67 | 703 | 704 |
| Power saving mode | OFF | OFF | OFF | - | 701b | 67c | OFF | 704b |
| | OFF | OFF | OFF | 701a | - | 67b | OFF | 704b |
| Regular mode | ON | OFF | OFF | - | 701b | 67c | OFF | 704a |
| | ON | OFF | OFF | 701a | 701a | 67b | OFF | 704a |
| | OFF | OFF | OFF | - | - | 67a | - | - |
| High-quality mode | ON | ON | ON | 701b | 701b | 67c | ON | 704a | though
HIGH-FREQUENCY RECEIVER AND PORTABLE DEVICE USING THE SAME

FIELD OF THE INVENTION

The present invention relates to high-frequency receivers to be used in tuners for receiving television signals, and it also relates to portable devices using the same receivers.

BACKGROUND OF THE INVENTION

FIG. 14 shows a block diagram illustrating a conventional high-frequency receiver. In FIG. 14, input terminal 1 receives high-frequency signals having frequencies ranging from 55.25 MHz to 801.25 MHz. Input terminal 1 connects to single-tuned filter 2 of which tuned frequency ranges from 367.25 MHz to 801.25 MHz (UHF broadcasting band). The tuned frequency is controlled by a tuning voltage supplied to frequency variable terminal 2a.

High-frequency amplifier 3 receives an output signal from single-tuned filter 2, amplifies signals of UHF band, and outputs the resultant signals to double-tuned filer 4. Filter 4 includes two variable capacitance diodes, and tuned frequencies are controlled by a tuning voltage supplied to frequency variable terminal 4a.

Mixer 5 receives an output signal from double-tuned filter 4 at its first input terminal 5f, and receives an output signal from local oscillator 6 at its second input terminal 5s via frequency divider 7. Mixer 5 mixes UHF band signals having undergone double-tuned filter 4 with oscillating signals supplied from local oscillator 6, and converts the resultant signals into intermediate frequency signals of 45.75 MHz.

Intermediate frequency filter 8 connects to an output terminal of mixer 5, and attenuates undesired signals in occupied frequency bandwidth of 6 MHz. Output signals from intermediate frequency filter 8 is supplied to output terminal 9 via intermediate frequency amplifier 25.

UHF signal receiving section 10 is thus formed of single-tuned filter 2, high-frequency amplifier 3, double-tuned filter 4, mixer 5 and intermediate frequency filter 8.

The high frequency signal supplied to input terminal 1 is also supplied to VHF signal receiving section 11, which receives signals having frequencies ranging from 55.25 MHz to 361.25 MHz (VHF broadcasting band). VHF signal receiving section 11 is formed of single-tune filter 12, high-frequency amplifier 13, double-tuned filter 14 and mixer 15.

Single-tuned filer 12 includes one variable capacitance diode, and its tuned frequency is controlled by a tuning voltage supplied to frequency variable terminal 12a. High-frequency amplifier 13 connects to an output terminal of single-tuned filter 12, and amplifies VHF band signals. Double-tuned filter 14 connects to an output terminal of high-frequency amplifier 13, and it has two variable capacitance diodes. Its tuned frequency is controlled by a tuning voltage supplied to frequency variable terminal 14a.

Image rejection mixer (IRM) 15 is formed of two mixers and two phase shifters. IRM 15 receives an output signal from double-tuned filter 14 at its first input terminal 15f, and receives an output signal from local oscillator 6 via frequency divider 16 at its second input terminal 15s. IRM 15 mixes the VHF band signals having undergone double-tuned filter 14 with oscillating signals supplied from local oscillator 6, and converts the mixed signals into signals having intermediate frequency of 45.75 MHz. IRM 15 supplies the resultant signals to intermediate filter 8 via lead-wire 26.

Local oscillator 6 includes OSC 17 of which input terminals 17a and 17b are connected to tuning section 18. Tuning section 18 is formed of series-connected unit 21 formed of variable capacitance diode 19 and capacitor 20 connected in series, and inductor 22 connected in parallel with unit 21.

Phase locked loop (PLL) circuit 23 placed approx. at the center of FIG. 14 receives output signals from OSC 17 at its input terminal, and supplies a tuning voltage from its output terminal 23a to variable capacitance diode 19 of tuning section 18. The tuning voltage is also supplied to respective variable capacitance diodes of single-tuned filter 2, double-tuned filter 4, single-tuned filter 12, and double-tuned filter 14. The tuning voltage thus controls oscillating frequency of local oscillator 6 as well as respective tuned frequencies of single-tuned filters 2, 12, double-tuned filters 4, 14.

Meanwhile, the prior art related to the present invention are disclosed, e.g. in Japanese Patent Unexamined Publication No. 2000-295539, 2002-118795, and H01-265688.

The conventional high-frequency receiver discussed above; however, must include two mixers and two phase shifters regardless of whether or not they receive signals having frequencies interfering with images in a received channel. Thus the receivers are required to consume less power, and it is hard particularly for battery-operated portable devices to achieve this requirement.

The present invention thus aims to provide high-frequency receivers consuming less power and portable devices using the same receivers.

SUMMARY OF THE INVENTION

The present invention determines whether or not image interference exists in a desirable channel to be received, and if the image interference is acknowledged, a power control circuit turns off a part of IRM circuit which is one of the mixers. This turn-off changes the mixer, which has been working as an IRM circuit, to work as a double balance mixer (DBM) circuit.

An image interference determiner detects and determines image interference in a desirable channel at the present position, and the power control circuit makes the mixer work as the DBM circuit when the determiner determines that no image interference exists.

The foregoing mechanism allows the mixer to work as the DBM circuit when the receiver of the present invention receives a channel free from image interference, so that the mixer consuming less power is obtainable. When the mixer works as the IRM circuit, it can reduce image interference.

BRIEF DESCRIPTION OF THE DRAWINGS

FIG. 6B shows operations of respective circuits and statuses of switches during the receptions of respective frequency bands in accordance with the first exemplary embodiment of the present invention.

FIG. 7B shows operations of respective circuits and statuses of switches during the receptions of respective frequency bands in accordance with the second exemplary embodiment of the present invention.

FIG. 9B shows operations of respective circuits and statuses of switches during the receptions of respective frequency bands in accordance with the third exemplary embodiment of the present invention.

FIG. 11B shows operations of respective circuits and statuses of switches during the receptions of respective frequency bands in accordance with the fourth exemplary embodiment of the present invention.

FIG. 13B shows operations of respective circuits and statuses of switches during the receptions of respective frequency bands in accordance with the fifth exemplary embodiment of the present invention.

DETAILED DESCRIPTION OF PREFERRED EMBODIMENTS

Exemplary Embodiment 1

Figure 1:
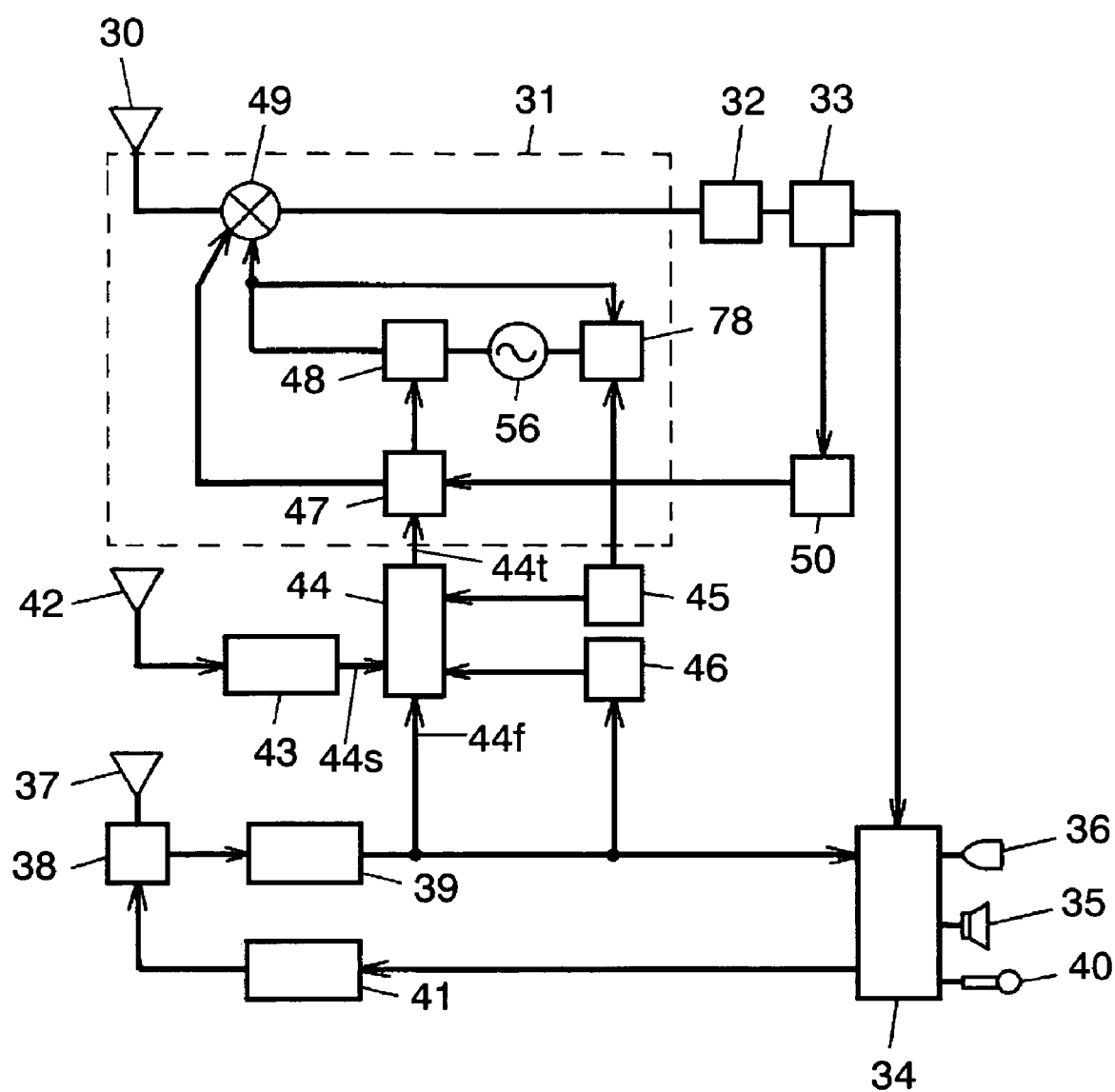
FIG. 1 shows a block diagram illustrating a portable receiver in accordance with a first exemplary embodiment of the present invention.

The first exemplary embodiment of the present invention is demonstrated hereinafter with reference to accompanying drawings. FIG. 1 shows a block diagram illustrating a portable high-frequency receiver. Antenna 30 for receiving television (TV) broadcastings receives, e.g. VHF broadcasting band as a first frequency band and UHF broadcasting band as a second frequency band. The frequencies of those bands range from approx. 55.25 MHz to 801.25 MHz. Antenna 30 connects to high-frequency receiver 31 at its output terminal. Receiver 31 selects signals of a desirable channel from among the received high-frequency signals, and outputs signals converted into an intermediate frequency of 45.75 MHz.

Demodulator 32 demodulates the intermediate frequency signals supplied from receiver 31. Decoder 33 receives output signals from demodulator 32 carries out vitebi-correction and reed-solomon correction, and the signals having undergone those corrections are output to speaker 35 or liquid crystal display 36 via signal processor 34.

Cellular phone antenna 37 receives cellular telephone signals having a frequency of approx. 800 MHz, and duplexer 38 receives output signals from antenna 37. Signals at an output terminal of duplexer 38 are converted into signal data via receiving section 39, then the converted signals are supplied to signal processor 34. Receiving section 39 is one of positional data obtaining means.

Audio signals supplied to microphone 40 are converted into digital signals by signal processor 34, and sent to transmitting section 41, where the audio signals are converted into telephone signals. The cellular telephone signals are radiated into the air from antenna 37 via duplexer 38 for propagation.

GPS antenna 42 receives signals, which are then supplied to GPS receiver 43, and receiver 43 outputs information about the present position of the portable receiver. GPS receiver 43 is used as another one of the positional data obtaining means.

Image interference determiner 44 receives output signals from receiving section 39 at its first input terminal 44$f$, and receives output signals from GPS receiver 43 as well as output signals from received channel data generator 45 at its second input terminal 44$s$ respectively. Image interference determiner 44 connects to memory 46 which has stored a data table of receivable channel frequencies corresponding to position data. Output terminal 44$t$ of determiner 44 connects to power supply controller 47 disposed in high-frequency receiver 31. Controller 47 connects to frequency divider 48 and mixer 49 of receiver 31, and turns on or off the power supplies of those elements. While the power supplies of divider 48 and mixer 49 are turned on (hereinafter this status is referred to as a regular mode), mixer 49 works as an image rejection mixer (IRM). On the other hand, while those power supplies are turned off (hereinafter referred to as a power-saving mode), mixer 49 works as a double balance mixer (DBM). In other words, mixer 49 has two functions, i.e. the IRM and the DBM.

In this first exemplary embodiment, receiving section 39 also supplies its output signals to memory 46, so that use of a cellular phone allows obtaining a frequency table of channels receivable at the present position via the Internet Web. As a result, in receivable channels, the receiver of the present invention can deal with changes caused by an additional broadcasting station.

Image interference generated in a high-frequency receiver that receives wide-band high-frequency signals such as TV broadcasting is described hereinafter. One of VHF broadcasting stations in Japan is taken as an example, that is Channel 4 using approx. 173 MHz. Since the intermediate frequency signal in this first embodiment uses 45.75 MHz, the frequency that generates image interference is approx. 219 MHz (the same frequency of Channel 12 of VHF in Japan). In other words, in an area where both Channel 4 and Channel 12 are receivable, when Channel 4 is received, the signals of Channel 12 interfere with the image. On the other hand, in an area where Channel 12 is not receivable, reception of Channel 4 does not involve image interference.

Next, an operation of high-frequency receiver 31 is demonstrated hereinafter. First, image interference determiner 44 obtains data of present position from receiving section 39 or GPS receiver 43, and retrieves data of receivable channel frequencies corresponding to the present position from the table stored in memory 46. On the other hand, when an operator of a portable receiver inputs a desirable channel through a keyboard (not shown), receivable channel data generator 46 generates the data of a desirable channel to be received, and this data is supplied to PLL circuit 78 and image interference determiner 44. Determiner 44 determines whether or not any channels among the desirable channels to be received at the present position involve image interference.

When determiner 44 determines that there is no channel which involves image interference to the receivable TV broadcasting channels at the present position, the receiver receives the broadcasting in the power saving mode. At this time, the power supplies of frequency divider 48 and mixer 49 are turned off, and mixer 49 works as the DBM, so that the high-frequency receiver consumes less power. On the other hand, if determiner 44 determines that there is a channel involving image interference to the TV channels receivable at the present position, the receiver receives the broadcasting in the regular mode.

In FIG. 1, signal quality determiner 50 is disposed between the output side of decoder 33 and the input side of power supply controller 47. Signal quality determiner 50 determines a bit-error rate of a received signal. When the bit-error rate of the signal supplied from decoder 33 becomes not less than 0.0002, determiner 50 sends a signal, which turns on parts of divider 48 and mixer 49, to power supply controller 47.

For instance, during the power-saving mode operation, when signal quality determiner 50 finds the bit-error rate not less than 0.0002, power supply controller 47 turns on frequency divider 48 and mixer 49 so that the operation is changed to the regular mode. Mixer 49 thus works as the IRM, and as a result, the bit-error rate adversely influenced by image interference can be improved.

Figure 2:
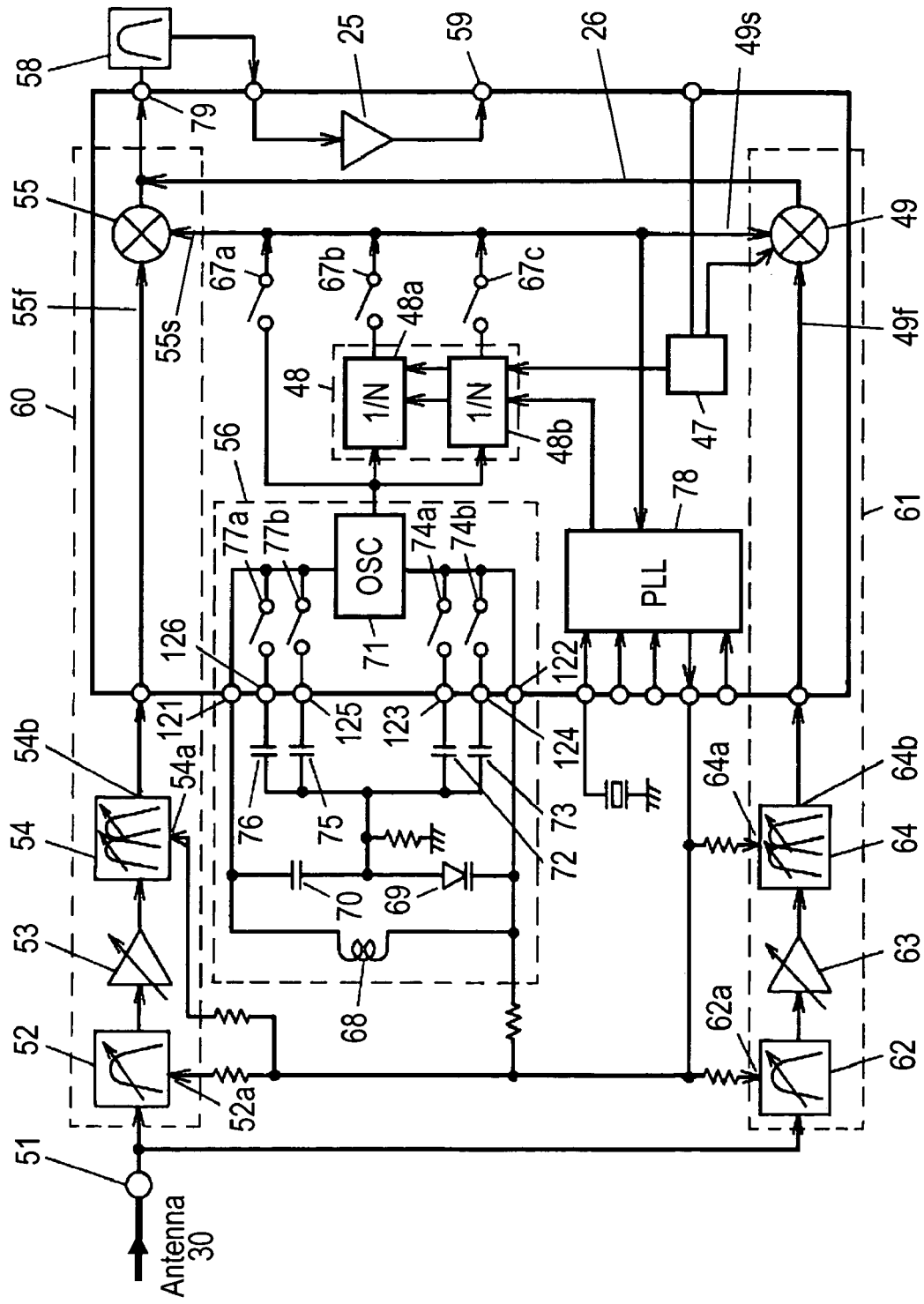
FIG. 2 shows a block diagram illustrating a high-frequency receiver in accordance with the first exemplary embodiment of the present invention.

Next, high-frequency receiver 31 in accordance with the first embodiment is demonstrated hereinafter with reference to FIG. 2, which shows a block diagram illustrating receiver 31. In FIG. 2, input terminal 51 is connected to antenna 30 shown in FIG. 1. Single tuned filter 52 includes a variable capacitance diode and connects to input terminal 51. Filter 52 controls tuned frequencies ranging from 367.25 MHz to 801.25 MHz (UHF broadcasting band). The tuned frequencies are controlled by a tuning voltage supplied to frequency variable terminal 52a.

High-frequency amplifier 53 connects to single-tuned filter, and amplifies signals of UHF broadcasting band. Amplifier 53 connects to double-tuned filter 54 at its output terminal. Filter 54 includes at least two variable capacitance diodes and its tuned frequencies are controlled by a tuning voltage supplied to frequency variable terminal 54a.

First input terminal 55f of mixer 55 connects to output terminal 54b of double-tuned filter 54, and second input terminal 55s receives output signals from local oscillator 56 via frequency divider 48. Mixer 55 also works as the DBM previously discussed, and mixes UHF band signals having undergone filter 54 with oscillating signals supplied from local oscillator 56, and converts the mixed signals into intermediate frequency signals of 45.75 MHz.

Output signals from mixer 55 are taken out from output terminal 79, and they are supplied to intermediate frequency filter 58, which attenuates undesired signals in occupied frequency band of 6 MHz. Output signals from filter 58 are supplied to output terminal 59 via intermediate frequency amplifier 25.

UHF signal receiving section 60 placed at the upper portion of FIG. 2 is formed of single-tuned filter 52, high-frequency amplifier 53, double-tuned filter 54, mixer 55 and intermediate frequency filter 58.

VHF signal receiving section 61 placed at the lower portion of FIG. 2 connects to single-tuned filter 62 at its input terminal 51, and high-frequency amplifier 63, double-tuned filter 62, mixer 49 are connected in this order after filter 62 onward. VHF signal receiving section 61 receives input signals supplied from input terminal 51, so that it receives VHF broadcasting signals having frequencies ranging from 55.25 MHz to 361.25 MHz.

Single-tuned filter 62 includes at least one variable capacitance diode, and its tuned frequency is controlled by a tuning voltage supplied to frequency variable terminal 62a. High-frequency amplifier 63 receives output signals from single-tuned filter 62, and amplifies the signals in VHF broadcasting band.

Double-tuned filter 64 receives output signals from amplifier 63. Filter 64 includes at least two variable capacitance diodes, and its tuned frequency is controlled by a tuning voltage supplied to frequency variable terminal 64a.

First input terminal 49f of mixer 49 connects to output terminal 64b of double-tuned filter 64, and second input terminal 49s receives output signals from local oscillator 56 via frequency divider 48. Mixer 49 mixes VHF band signals having undergone filter 64 with oscillating signals from local oscillator 56, and converts the mixed signals into intermediate frequency signals of 45.75 MHz. Mixer 49 outputs signals to output terminal 79 via lead-wire 26, and the output signals are supplied to intermediate frequency filter 58.

Frequency divider 48 placed approximately at the center of FIG. 2 includes divider 48a for VHF low-band broadcasting and divider 48b for VHF high-band broadcasting. Switches 67a, 67b and 67c are ones of means for switching the dividers. To be more specific, they switch selectively the oscillating signals from local oscillator 56, the output signals from dividers 48a, 48b, thereby switching the output signals to be supplied to mixers 55 and 49.

Local oscillator 56 includes inductor 68, and a series-connected unit of variable capacitance diode 69 and capacitor 70. This unit connects to inductor 68 in parallel, thereby forming a tuning section. The series-connected unit connects to OSC 71 at its both terminals. OSC 71 connects to the tuning section in parallel, and its oscillating signals are controlled by oscillating frequency changing means connected to OSC 71.

The oscillating frequency changing means is formed of capacitors 72, 73, and switches 74a, 74b, 77a, 77b, connected in parallel with variable capacitance diode 69.

In this first embodiment, switching of switches 74a, 74b, 77a, 77b allows changing a capacitance value to be coupled in series to oscillating variable capacitance diode 69 and a capacitance value to be coupled in parallel with diode 69. As a result, a tuned frequency of the tuning section can be changed, so that an oscillating frequency of the local oscillator can be minutely controlled.

Variable capacitance diodes can be used instead of switches 74a, 74b, 77a, 77b and capacitors 72, 73, 75, 76. In this case, the diodes replacing switches 77a, 77b and capacitors 72, 73, 75 and 76 can change their own capacitance in response to a voltage applied thereto, so that an oscillating frequency of the local oscillator can be minutely changed. Those diodes are referred to as "frequency minutely changing diode" hereinafter.

Only this case, a voltage control circuit, which controls a voltage to be supplied to each one of the frequency minutely changing diodes, is needed. This control circuit changes the voltage to be supplied to the diodes discussed above in response to the supplied data of received channels, thereby changing minutely the oscillating frequency of the local oscillator.

Oscillating signals from local oscillator 56 are divided by frequency divider 48, and then supplied to an input side of PLL circuit 78. PLL circuit 78 supplies a tuning voltage to variable capacitance diodes 82, 84, 86, 89, 96, 98, 102, 107 (shown in FIGS. 3 and 4) of single-tuned filter 52, double-tuned filter 54, single-tuned filter 62 and double-tuned filter 64. It also supplies the tuning voltage to oscillating variable capacitance diode 69.

Figure 3:
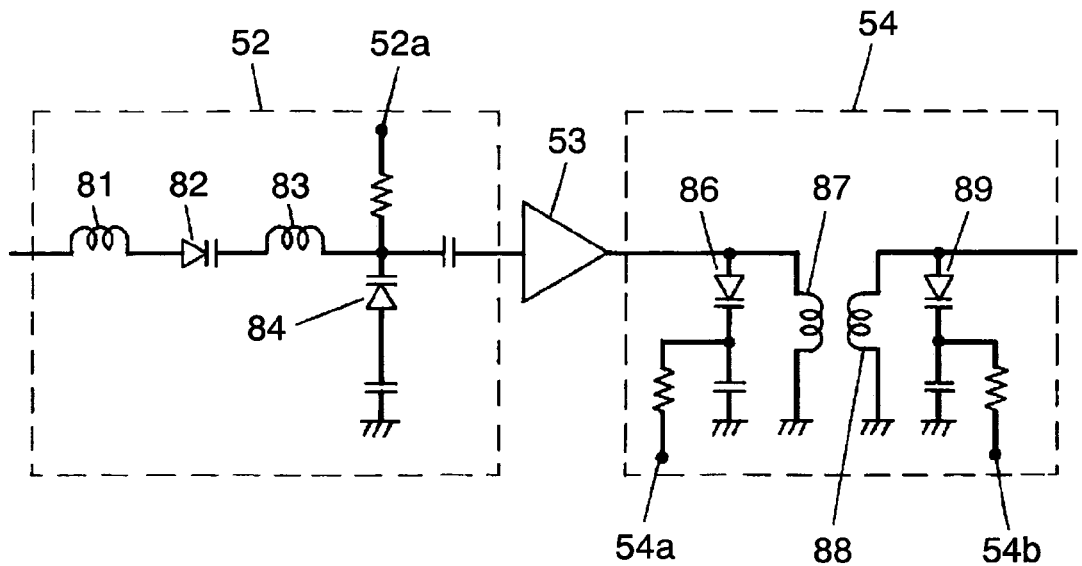
FIG. 3 shows a circuit diagram of a tuned filter which receives UHF band in accordance with the first exemplary embodiment of the present invention.

FIG. 3 shows an actual circuit diagram of single-tuned filter 60 and double-tuned filter 54 disposed in UHF signal receiving section 60 in accordance with the first embodiment. Filter 52 is formed of inductors 81, 83, and variable capacitance diodes 82, 84. Frequency variable terminal 52a is coupled to the cathodes of diodes 82, 84 via resistors.

The tuning voltage supplied from PLL circuit 78 changes the capacitance of diodes 82, 84 of single-tuned filter 52, so that the tuned frequency can be controlled. A filter constant of filter 52 is selected such that the UHF band signals can pass through filter 52.

Next, double-tuned filter 54 is described hereinafter. Filter 54 is formed of two variable capacitance diodes 86, 89 and two inductors 87, 88. Frequency variable terminals 54a, 54b are coupled respectively to the cathodes of diodes 86, 89 via resistors. PLL circuit 78 supplies the tuning voltage from its output side. Filter 54 changes the capacitance of diodes 86, 89 in response to the tuning voltage supplied to terminals 54a and 54b, thereby controlling the tuned frequency.

Figure 4:
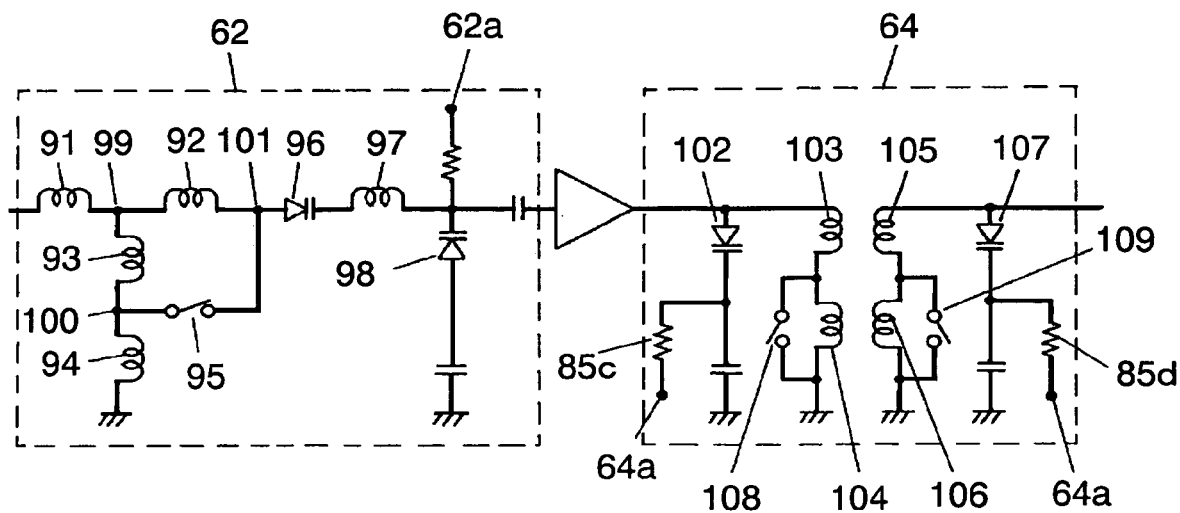
FIG. 4 shows a circuit diagram of a tuned filter which receives VHF band in accordance with the first exemplary embodiment of the present invention.

FIG. 4 shows a circuit diagram of single-tuned filter 62 and double-tuned filter 64 disposed in VHF signal receiving section 61 in accordance with the first embodiment. Filter 62 includes inductors 91, 92, 93, 94, 97, switch 95, and variable capacitance diodes 96, 98. Frequency variable terminal 62a is coupled to the cathode of diode 98 via resistor 85b, and receives a tuning voltage from an output side of PLL circuit 78.

Diodes 96, 98 of single-tuned filter 62 change their capacitance in response to the tuning voltage supplied to terminal 62a, so that the tuned frequency is controlled. A filter constant of filter 62 is selected such that the VHF band signals can pass through filter 62.

Double-tuned filter 64 includes variable capacitance diodes 102, 107, inductors 103, 104, 105, 106, and switch 108. Frequency variable terminal 64a is coupled to the cathodes of diodes 102, 107 respectively via resistors 85c, 85d. Terminal 64a receives a tuning voltage from PLL circuit 78. Diodes 102, 107 change their capacitance in response to the tuning voltage supplied to terminal 64a of filter 64, so that the tuned frequency can be changed.

In receiving TV broadcastings, an operation of the high-frequency receiver in accordance with the first embodiment is demonstrated again hereinafter with reference to FIG. 2. First, when the receiver receives UHF broadcasting band, switches 74a, 74b, 77a, 77b are turned off, and switch 67a is turned on so that frequency divider 48 can supply its output.

When the receiver receives VHF high-band, switches 74a, 77a are turned on, and switches 74b, 77b are turned off. Switch 67b is turned on so that divider 48a can supply its output. Switches 95, 108, 109 (shown in FIG. 4) are turned on.

When the receiver receives VHF low-band, switches 74a, 77a are turned off, and switches 74b, 77b are turned on. Switch 67c is turned on so that divider 48b can supply its output. Switches 95, 108, 109 are turned off.

When the receiver receives UHF band, high-frequency amplifier 53 is turned on, and when the receiver receives VHF band, high-frequency amplifier 63 is turned on. The reason is this: turning off the high-frequency amplifier on the non-receiving band side allows interrupting high-frequency signals, which have passed through tuned filter 52 or 62, to mixer 55 or 49. This mechanism allows converting desirable high-frequency signals into intermediate frequency signals.

A value of inductor 68 of local oscillator 56 is approx. 20 nH, and that of capacitor 70 is 22 pF. In this condition, capacitance of variable capacitance diode 69 is preferably changed between 31 pF and 2.7 pF in response to an applied voltage between 2V and 25V. Local oscillator 56 thus constructed oscillates signals having frequencies ranging from 350 MHz to 850 MHz during the reception of UHF band. It oscillates signals having frequencies between 358 MHz and 814 MHz during the reception of VHF high-band, and between 404 MHz and 692 MHz during the reception of VHF low-band.

Local oscillator 56 supplies its oscillating signals straightly to mixer 55 when the receiver receives UHF band, thereby obtaining intermediate frequency signals of 45.75 MHz. On the other hand, when the receiver receives VHF high-band, the oscillating signals from oscillator 56 are divided their frequencies into ½ by frequency divider 48a before they are supplied to mixer 49, so that intermediate frequency signals of 45.75 MHz can be obtained.

When the receiver receives VHF low-band of NTSC system broadcasting, the oscillating signals of local oscillator 56 are divided their frequencies into ¼ by frequency divider 48b before the signals are supplied to mixer 49, so that intermediate frequency signals of 45.75 MHz can be obtained. Power supply controller 47 connects to dividers 48a, 48b and mixer 49, and turns on or off them in response to an output supplied from image interference determiner 44 to power-supply controller terminal 47a.

It is important to set the tuning voltages of single-tuned filters 52, 62 and double-tuned filters 54, 64 and the local oscillator for each channel at approx. the same value in the respective broadcasting bands. In other words, tuning voltage characteristics of filters 52, 62, 54, 64 with respect to each channel are preferably approximated to each other in the respective broadcasting bands. This preparation is needed in order to obtain the intermediate frequency signal from mixers 55, 49. For that purpose, tuned-frequencies of single-tuned filters 52, 62 and double-tuned filter 54, 64 are tied to each other by local oscillator 56 and the frequency dividers, so that high output signals in response to the intermediate frequencies can be obtained consistently. This is one of design requirements for high-frequency receivers to receive high-frequency signals.

In this first embodiment, switches 74a, 74b, 77a, 77b switch capacitors 72, 73, 75, 76, thereby changing minutely capacitance of the tuning section of local oscillator 56, and obtaining local oscillating frequency characteristics with respect to the tuning voltages adaptive to the respective receivable broadcasting bands. The preparation discussed above allows the TV broadcasting in the USA to be receivable ranging from VHF low-band to UHF band, i.e. all the consecutive channels from 55.25 MHz to 801.25 MHz.

When switching of switches 74a, 74b turns on either one of capacitor 72 or 73, some capacitance is input in parallel with oscillating variable capacitance diode 69. If diode 69 has smaller capacitance than this some capacitance, diode 69 cannot contribute so much to the oscillating frequency of oscillator 56. Thus the oscillating frequency of oscillator 56 at a higher band, where the capacitance of diode 69 turns out smaller, can be varied conspicuously.

When switching of switches 77a, 77b turns on either one of capacitor 75 or 76, some capacitance is input in parallel with capacitor 70. This preparation reduces capacitance to be input in series with diode 69, so that diode 69 can contribute the oscillating frequency of oscillator 56 in greater amount, and a range of the oscillating frequency with respect to a tuning voltage can be changed.

Adjustment of the capacitance of capacitors 72, 73, 75, 76 at given values as discussed above allows determining characteristics of channels (frequencies) and tuning voltages in the respective frequency bands, i.e. UHF band, VHF high-band and VHF low-band, independently. Thus the characteristics of the tuning voltages at local oscillator 56 with respect to receivable channels (frequencies) in the respective bands can be approximated to the characteristics of the tuning voltages of filters 52, 62, 54, 64 with respect to receivable channels (frequencies). Further, switches 74, 77 are turned on or off, thereby switching capacitors 72, 73, 75, 76 in response to the frequency band to be received, so that all the consecutive TV channels in the USA, i.e. from VHF band to UHF band (55.25 MHz to 801.25 MHz) can be received.

The high-frequency receiver in accordance with the first embodiment employs oscillating variable capacitance diode 69, variable capacitance diodes 84, 86, 89 (shown in FIG. 3), variable capacitance diodes 98, 102, 107 (shown in FIG. 4), all of which have approx. the same capacitance changing characteristics. As a result, it becomes easier to approximate the tuned frequency characteristics of single-tuned filters 52, 62 or double-tuned filters 54, 64 with respect to the tuning voltage to the tuned frequency characteristics of the tuning section of local oscillator 56 with respect to the tuning voltage.

Oscillating variable capacitance 69, variable capacitance diodes 84, 86, 89 (shown in FIG. 3) and variable capacitance diodes 98, 102, 107 (shown in FIG. 4) employ the diodes that have the same capacitance changing rate as that of diode 98, of which capacitance changing rate can change the tuned frequency of single-tuned filter 62 in response to VHF band.

The reason of employing such diodes is that VHF band, particularly VHF high-band, needs the greatest capacitance changing rate. As a result, diodes 69, 84, 86, 89, 98, 102, 107 can employ diodes of the same characteristics and the same part-number, so that the part control becomes easier. On top of that, mounting wrong parts can be prevented.

Frequency divider 48 and mixer 49 in accordance with the first embodiment are demonstrated hereinafter with reference to FIG. 5, which details divider 48 and mixer 49. Local oscillator 56 is formed of a balance circuit and outputs signals of phase 0 degree and of phase 180 degrees respectively.

Divider 201 for dividing a frequency into ½ (hereinafter referred to ½ divider) connects to an output of local oscillator 56, and divides an input signal into ½ frequency. Divider 201 outputs four signals having a phase difference of 90 degrees from each other. ½ divider 205 connects to contact 204b of switch 204. Four output signals from divider 205 are supplied to respective contacts 67c of switch 67. Input terminal 205f of divider 205 receives signals from ½ divider 201, and the signals have a phase difference of 180 degrees from each other, and terminal 205f outputs four signals having a phase difference of 90 degrees from each other Mixer 49 is formed of mixer 49a, 90-degree phase shifter 49c connected to mixer 49a, and mixer 49b connected in parallel with a series-connected unit of mixer 49c and phase-shifter 49c.

Mixer 49a connects to output terminal 64b of double-tuned filter 64 at its first input terminal 49af, and connects to a common terminal of switch 67 at its second input terminal 49as. On the other hand, mixer 49b connects to output terminal 64b of filter 64 at its first input terminal 49bf, and connects to common terminal 67k of switch 67 at its second input terminal 49bs. An output from mixer 49a and an output signal from 90-degree phase-shifter 49c are supplied to output terminal 79 (shown in FIG. 2).

The regular operation mode in accordance with the first embodiment is demonstrated hereinafter. During the reception of UHF band, frequency dividers 201, 205, mixer 49 and phase-shifter 49c stay turned-off.

During the reception of VHF high-band, switch 204 connects to contact 204a and switch 67 connects to contact 67b. Divider 201 is turned on while divider 205 is turned off. This preparation allows dividing a signal frequency supplied from local oscillator 56 into ½.

During the reception of VHF low-band, switch 204 connects to contact 204b, and switch 67 connects to contact 67c. This preparation allows further connecting ½ divider 205 between divider 201 and vector synthesizers 202, 203. Then divider 205, mixer 49, and phase-shifter 49c are turned on, so that the signal frequency supplied from local oscillator 56 is divided into ¼.

Next, an operation in the power saving mode is demonstrated. During the reception of VHF high-band, mixer 49b and phase-shifter 49c are turned off additionally to the regular mode operation. Further, switch 204 connects to contact 204a, and switch 67 connects to contact 67b. This structure allows divider 201 to divide the signal frequency supplied from local oscillator 56 into ½ before the signal is supplied to mixer 49a.

During the reception of VHF low-band, mixer 49b and phase-shifter 49c are turned off additionally to the regular mode operation. Further, switch 204 connects to contact 204b and switch 67 connects to contact 67c. This structure allows divider 201 and divider 205 to divide the signal frequency supplied from local oscillator 56 into ¼ before the signal is supplied to mixer 49a.

Figure 5:
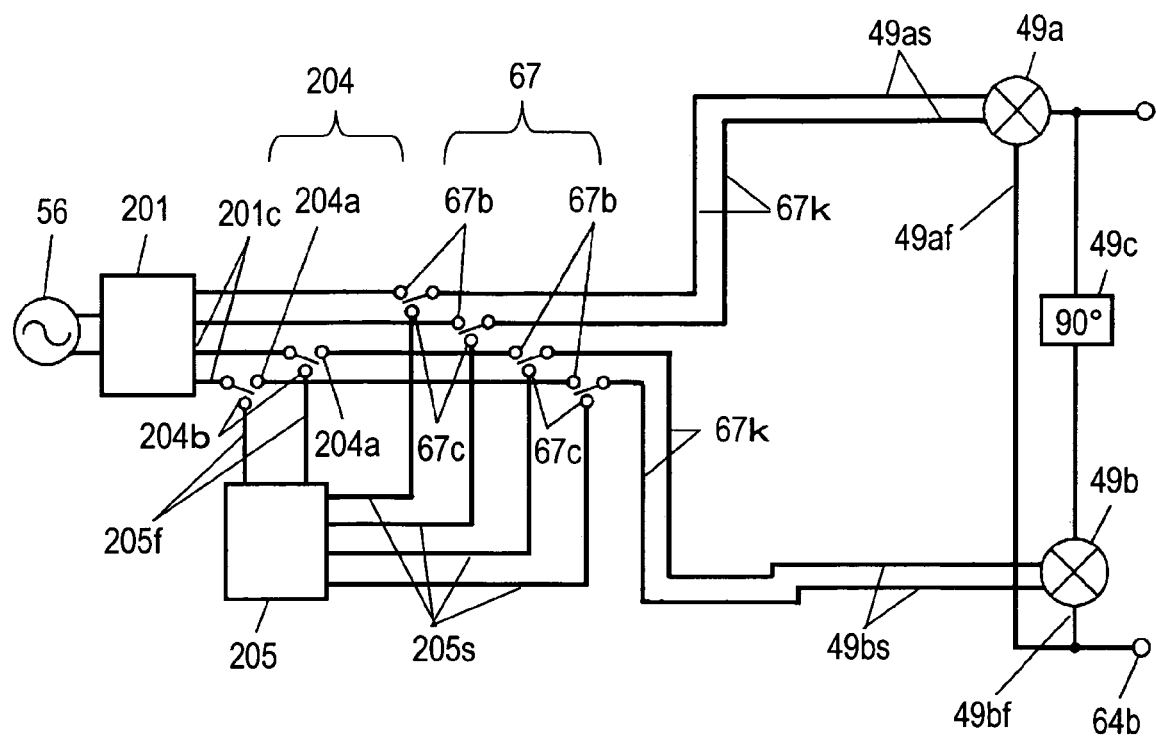
FIG. 5 shows a block diagram detailing a frequency divider and a mixer in accordance with the first exemplary embodiment of the present invention.

An operation of frequency dividers 201, 205 shown in FIG. 5 is demonstrated hereinafter with reference to FIG. 6A, which shows timing charts of signals in accordance with the first embodiment.

Figure 6A:
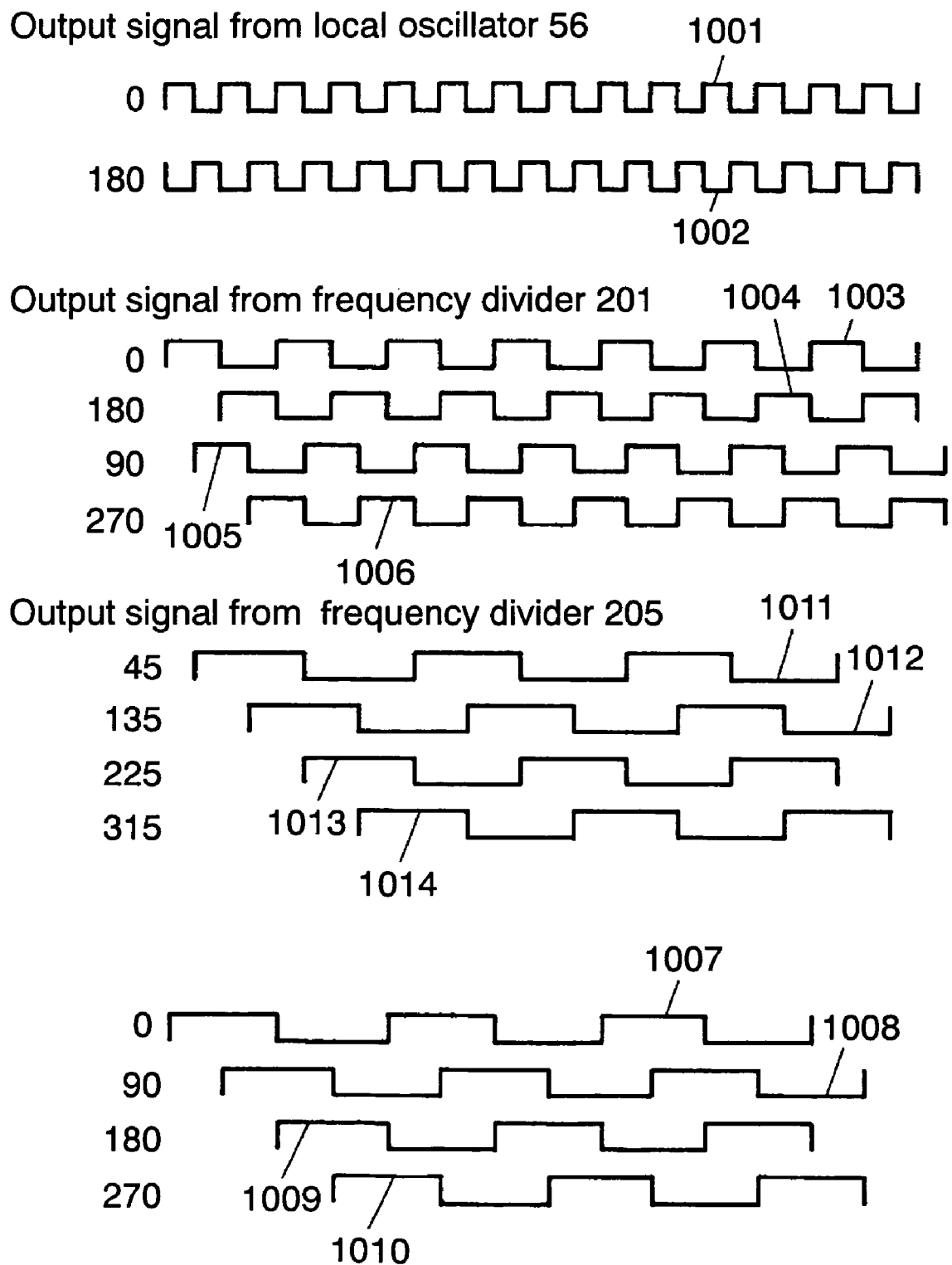
FIG. 6A shows timing charts of signals in accordance with the first exemplary embodiment of the present invention.

In FIG. 6A, local oscillator 56 outputs signals 1001, 1002 having a phase difference of 180 degrees from each other. Those signals are supplied to divider 201, which outputs signals 1003, 1004, 1005, 1006 having a phase difference of 90 degrees from each other. On the other hand, divider 205 receives signals 1005, 1006, so that divider 205 outputs four signals 1007, 1008, 1009, 1010 having a phase difference of 90 degrees from each other.

The foregoing structure allows using the IRM and the DBM by switching, so that the power consumption can be reduced when no image interference exists. Mixer 49 thus can work as the DBM, so that a portable receiver consuming less power is obtainable.

In this first embodiment, ½ frequency dividers 201, 205 are formed of flip-flop circuit, so that a structure of the circuit can be simplified, and use of an integrated circuit will achieve smaller chips. In the case of obtaining local oscillating signals by dividing the frequencies of the oscillating signals supplied from local oscillator 56, divider 48 can be a phase-shifter by itself, so that the IRM circuit can be downsized.

We have discussed that divider 205 receives output signals 1005, 1006; however, divider 205 can receive output signals 1003, 1004 instead. In this case, output signals 1011, 1012, 1013, 1014 having a phase difference of 90 degrees from each other can be obtained. In other words, as long as divider 205 receives signals having a phase difference of 180 degrees, it can outputs four signals having a phase difference of 90 degrees from each other.

On top of that, since the IRM can reduce image interference, an attenuating amount of the signals which cause image interference in single-tuned filter 62 or double-tuned filter 64 can be lowered. For instance, filter 64 can be replaced with a low-pass filter during the reception of VHF low-band or VHF high-band. This low-pass filter switches the cut-off frequencies of the respective bands to the VHF low-band upper limit frequency or the VHF high-band upper limit frequency.

Local oscillator 56 changes the oscillating signals in response to a band to be received such that they are tied to the frequency characteristics of single-tuned filter 62 or double-tuned filter 64, so that a range of the oscillating frequency of local oscillator 56 can be broadened with respect to the tuning voltage. Thus, for instance, if channels between UHF band and VHF band are consecutive, those channels can be received without any problems. As a result, the present invention can provide a high frequency receiver which can receive consecutive channels across the wide band covering VHF and UHF bands of the TV broadcastings.

Oscillating frequency changing means can change oscillating signals in response to a band to be received such that the oscillating signals are tied to the frequency characteristics of filter 62 or filter 64. Therefore, the center frequency of the pass band at filter 62 or filter 64 of a desirable channel to be received can be approximated to the frequency of the desirable channel signals. Filter 62 or filter 64 can thus attenuate undesired interference signals, thereby further reducing image interference.

In this first embodiment, OSC 71, switches 74, 77, frequency dividers 57, 48, mixers 55, 49 and PLL circuit 78 are packed in one integrated circuit, so that the high-frequency receiver can be downsized.

FIG. 6B shows operations of the respective circuits and statuses of the respective switches during the reception of the respective frequency bands in accordance with this first embodiment. In FIG. 6B, reception band VL stands for VHF low-band, and VH stands for VHF high-band.

In FIG. 5 and FIG. 6B, when VHF high-band is selected as the band to be received, the mixer works as the DBM (double balance mixer) circuit. At this time, frequency divider 201 stays turned-on and divider 205 stays turned-off. Mixer 49a stays turned on, mixers 49b, 55 stay turned-off. Phase-shifter 49c stays turned-off. Switch 204 is shut off and stays turned-off, and switch 67 connects to contact 67c.

In FIG. 5 and FIG. 6B, when VHF low-band is selected as the band to be received, the mixer works as the IRM (image rejection mixer) circuit. At this time, frequency dividers 201, 205 stay turned-off as they are in the power-saving mode. Mixers 49a, 49b stay turned-on, while mixer 55 stays turned-off. Phase-shifter 49c stays turned-on. Switches 204, 67 connect to contacts 204c, 67c respectively.

FIG. 6B shows the statuses of respective circuits and switches during the reception of respective frequency bands, and those statuses are also shown in FIGS. 7B, 9B, 11B and 13B in response to the respective embodiments to be discussed later.

Exemplary Embodiment 2

A mixer in accordance with the second embodiment is described hereinafter with reference to FIG. 7. FIG. 7A shows a block diagram of the mixer. In this second embodiment, vector synthesizers 202, 203, limiting circuits 206, 207, and switches 208, 209 are additionally provided to the construction of the first embodiment. Switches 208, 209 are used as one of mixer input switching means. Elements similar to those used in the first embodiment have the same reference marks.

Figure 7A:
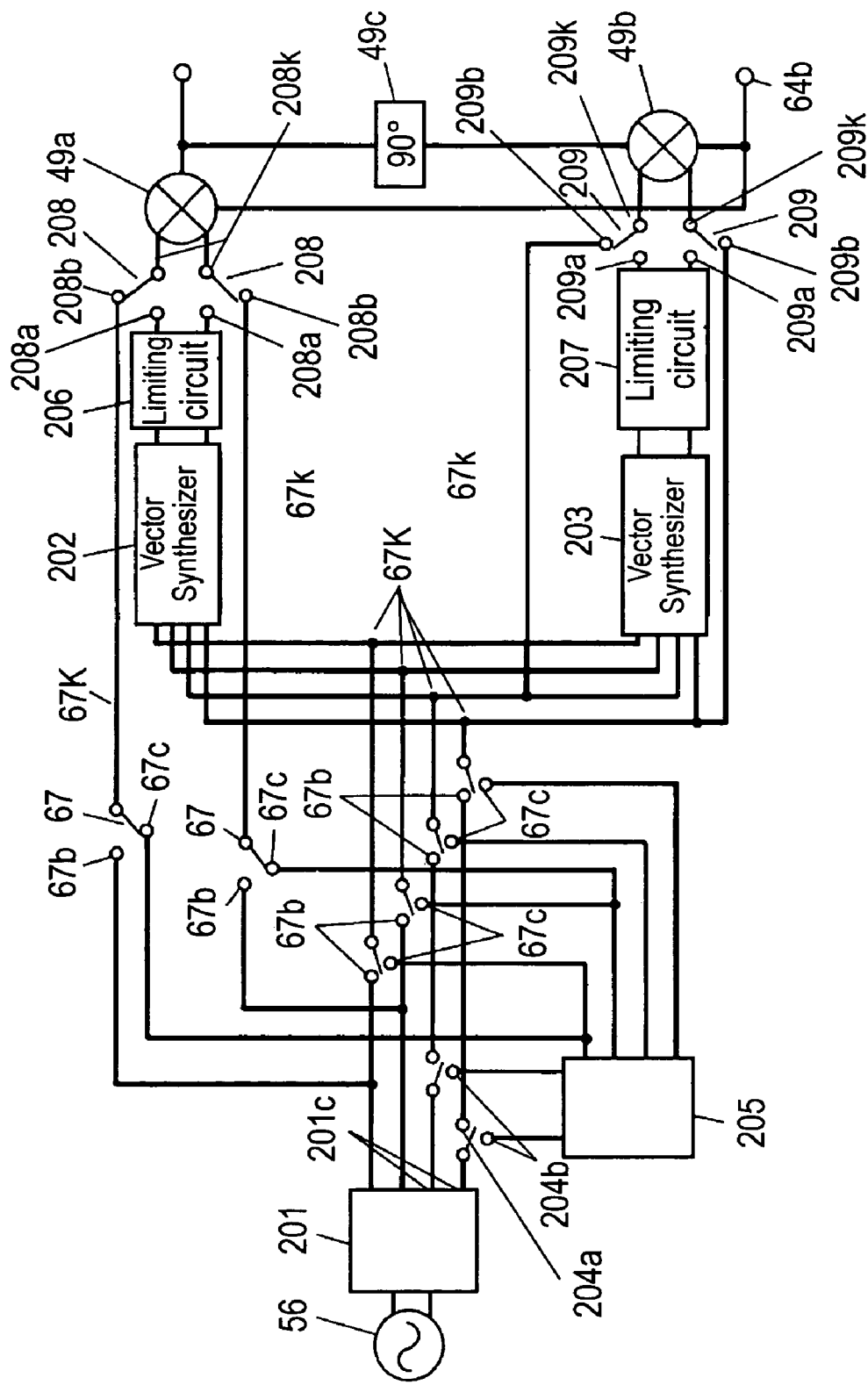
FIG. 7A shows a block diagram illustrating a frequency divider and a mixer in accordance with a second exemplary embodiment of the present invention.

In FIG. 7A, switch 67 connects to each one of four outputs from frequency divider 201. Switch 67 is connected to vector synthesizers 202, 203 at its common terminal 67k. When switch 67 selects contacts 67b, the output signals from divider 201 connect to vector synthesizer 202, so that four output signals are fed into synthesizer 202. Limiting circuits 206, 207 connect to synthesizers 202, 203 respectively, and they limit the signals supplied from synthesizers 202, 203 to a given level before the signals are fed into mixers 49a, 49b.

Switch 208 works as the mixer input switching means, and its contact 208a connects to an output terminal of limiting circuit 206. Another contact 208b connects to common terminal 67k of switch 67. Switch 208 connects to mixer 49a at its common terminal 208k.

Contact 209a of switch 209 connects to an output terminal of limiting circuit 207, and contact 209b connects to common terminal 67k of switch 67, and common terminal 209k connects to mixer 49b.

An operation of vector synthesizers 202, 203 in accordance with the second embodiment is demonstrated hereinafter. Vector synthesizers 202, 203 synthesize the following signals shown in FIG. 6A: a signal of phase 0 degree, e.g. output signal 1003 or 1007, a signal of phase 90 degrees, e.g. oscillating signal 1005 or 1009, a signal of phase 180 degrees, e.g. output signal 1004 or 1009, a signal of phase 270 degrees, e.g. output signal 1006 or 1010. In other words, synthesizers 202, 203 generate four signals having a phase difference of 90 degrees from each other.

To be more specific, vector synthesizer 202 generates a signal of phase 45 degrees using signals of phase 0 degree and phase 90 degrees. It also generates a signal of phase 225 degrees using signals of phase 180 degrees and phase 270 degrees. On the other hand, synthesizer 203 generates a signal of phase 135 degrees using signals of phase 90 degrees and phase 180 degrees. It also generates a signal of phase 315 degrees using signals of phase 0 degree and phase 270 degrees. This mechanism allows synthesizers 202 and 203 to generate signals having a phase difference of 90 degrees from each other.

Next, an operation of the mixer during the reception of TV broadcastings in accordance with the second embodiment is detailed hereinafter. First, the operation in the regular mode is demonstrated. During the reception of VHF high-band in the regular mode, frequency divider 201, vector synthesizers 202, 203, limiting circuits 206, 207, mixers 49a, 49b and phase-shifter 49c stay turned-on, while divider 205 stays turned-off. Switch 204 selects contact 204a, switch 67 selects contact 67b, switch 208 selects contact 208a, and switch 209 selects contact 209a. This status allows vector synthesizers 202, 203 to output signals having a phase difference of 90 degrees from each other and having undergone the dividers where the frequencies of the signals supplied from local oscillator 56 are divided into ½. Those signals are then supplied to mixers 49a, 49b, which work as the IRM.

During the reception of VHF low-band, switch 204 selects contact 204b and switch 67 selects contact 67c. This status allows supplying signals output from local oscillator 56 with their frequencies divided into ¼ to mixers 49a, 49b, which work as the IRM. The signals have a phase difference of 90 degrees from each other.

Next, an operation of the mixer in the power-saving mode is demonstrated hereinafter. During the reception of VHF high-band, vector synthesizers 202, 203, limiting circuits 206, 207, mixer 49b and phase-shifter 49c stay turned-off. In this status, switch 208 selects contact 208b, then signals divided their frequencies into ½ by divider 201a are supplied to mixer 49a. Mixer 49a works as the DBM, so that lower power consumption can be expected.

During the reception of VHF low-band, vector synthesizers 202, 203, limiting circuits 206, 207, mixer 49b and phase-shifter 49c are turned off. Then switch 208 selects contact 208b. This status allows frequency divider 201 to divide the frequencies of the signals into ½, and those signals are supplied to mixer 49a. Mixer 49a works as the DBM, lower power consumption can be expected.

Next, the intermediate mode shown in FIG. 7B will be described. When image interference stays at a low level, it is not necessary to execute vector synthesizing. Therefore, switch 209 is disposed between limiting circuits 207 and mixer 49b. And, limiting circuit 207 is connected to contact 209a of switch 209, and common terminal 67k of switch 67 is connected to contact 209b. Common terminal 209k of switch 209 is connected to mixer 49b. In this way, switch 208 is connected to contact 208b, and also, switch 209 is connected to 209b, while vector synthesizers 202, 203 and limiting circuits 206, 207 are turned off. Accordingly, the intermediate mode of (FIG. 7B) is obtained, and it operates as IRM the same as in the normal mode in the preferred embodiment 1. In this case, since vector synthesizers 202, 203 and limiting circuits 206, 207 are not operated, the power consumption can be more reduced as compared with the normal mode in the preferred embodiment 2.

In this second embodiment, since synthesizers 202, 203 and limiting circuits 206, 207 are provided, even if frequency dividers 201, 205 produce errors in the phases, signals having a phase difference of 90 degrees can be positively obtained. Thus signals having an accurate phase are obtainable with respect to such wide-band frequencies as the present invention handles, so that signals generating image interference can be largely suppressed.

FIG. 7B shows relations between the respective circuits and statuses of the switches in each mode. In FIG. 7B, receivable band "VL" stands for VHF low-band, and "VH" stands for VHF high-band. The way of reading the statuses of the switches is the same as that shown in FIG. 6B described in the first embodiment, so that detailed description is omitted here.

Exemplary Embodiment 3

The third exemplary embodiment is described hereinafter with reference to FIG. 8, which shows a block diagram of a high-frequency receiver in accordance with the third embodiment. Elements similar to those used in FIG. 2 described in the first embodiment have the same reference marks here.

Figure 8:
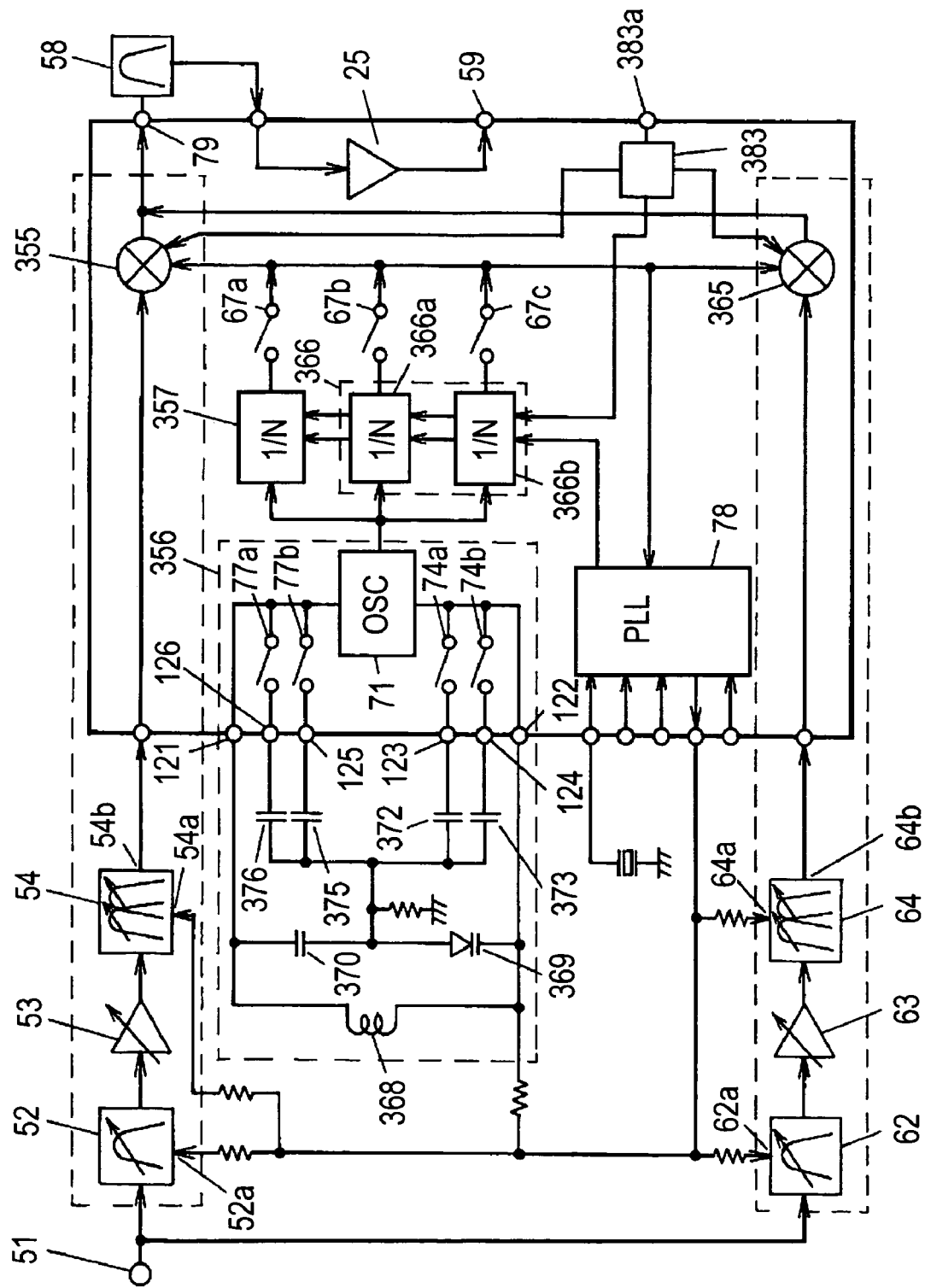
FIG. 8 shows a block diagram illustrating a high-frequency receiver in accordance with a third exemplary embodiment of the present invention.

Oscillator 356 placed approx. at the center of FIG. 8 oscillates signals having frequencies ranging from 700 MHz to 1700 MHz. In other words, oscillator 356 is a local oscillator having frequencies twice as much as that of the first embodiment. Those oscillating frequencies are determined by inductor 368 and variable capacitance diode 369, and the capacitance of respective capacitors 372, 373, 375, and 376 are adjusted at given values. For the respective receivable bands, changing characteristics of single-tuned filters 52, 62, double-tuned filter 54, 64 and local oscillator 356 with respect to tuning voltages are approximated to each other so that the difference between the frequency of local oscillator 356 and passing frequencies of filters 52, 62, 54, 64 can become approx. equal to the intermediate frequency (45.75 MHz).

In this third embodiment, mixer 355 employs IRM, frequency divider 366a divides frequencies into ¼, and divider 366b divides frequencies into ⅛. Divider 357 and switch 67a are connected between local oscillator 356 and mixer 355. Mixers 355, 365 connect to output terminal 79 at their output sides. Output signals taken out from output terminal 79 are supplied to intermediate frequency filter 58. Mixer 355 is used during the reception of UHF band, and mixer 365 is used during the reception of VHF high-band.

Mixer power supply controller 383 connects to divider 366, and mixers 355, 365. Control terminal 388a of controller 383 receives control signals supplied from image interference determiner 44 (shown in FIG. 1). Parts of the circuits of divider 366, mixer 355 or 365 are turned on or off in response to the control signals.

Figure 9A:
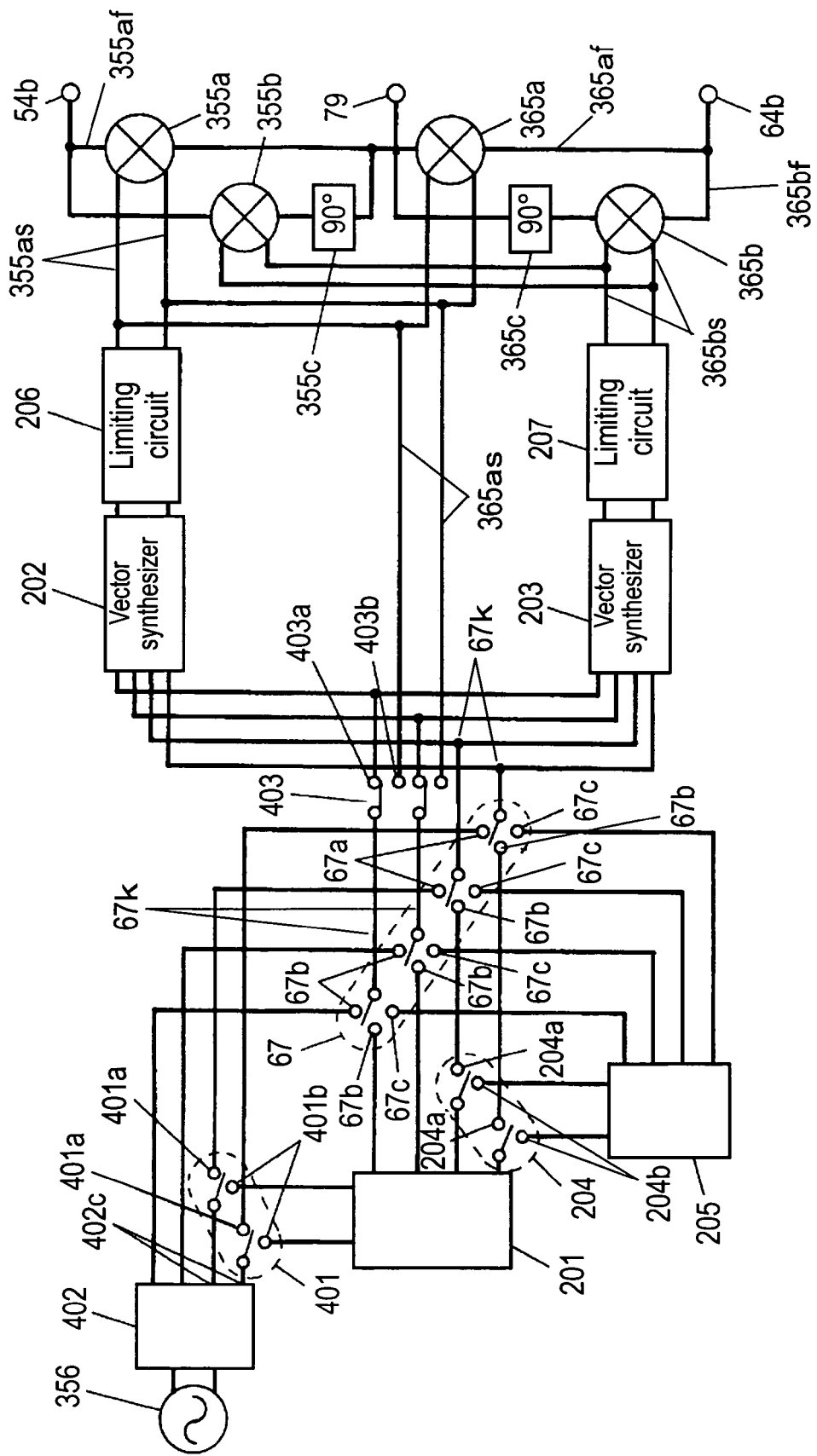
FIG. 9A shows a block diagram detailing a frequency divider and a mixer in accordance with the third exemplary embodiment of the present invention.

Next, operations of frequency dividers 357, 366, and mixers 355a, 355b, 365a, 365b with reference to FIG. 9A are demonstrated hereinafter. FIG. 9A shows a detailed block diagram illustrating frequency dividers and mixers in accordance with the third embodiment. Elements similar to those used in FIGS. 2, 5, and 7A have the same reference marks, and the descriptions thereof are simplified here.

Mixer 355a connects to output terminal 54b of double-tuned filter 54 at its first input terminal 355af, and connects to an output terminal of limiting circuit 206 at its second input terminal 355as. Mixer 355b connects to 90-degree phase shifter 355c at its output side. Mixer 355b and phase-shifter 355c form a series-connected unit, which is connected in parallel with mixer 355a. Mixer 355a and phase-shifter 355c supply their output signals to output terminal 79.

On the other hand, in FIG. 9A, mixer 365a connects to output terminal 64b of double-tuned filter 64 at its first input terminal 365af, and connects to an output terminal of limiting circuit 206 at its second input terminal 365as.

Mixer 365a is connected in parallel with the series-connected unit of mixer 365b and phase-shifter 365c. Mixer 365a and phase shifter 365c supply their output signals to output terminal 79. Mixer 365b connects to output terminal 64b of double-tuned filter 64 at its first input terminal 365bf, and connects to an output terminal of limiting circuit 207 at its second input terminal 365bs. Mixer 365b connects to 90-degree phase shifter 365c at its output terminal.

Switch 67 switches three input signals, and connects to vector synthesizers 202, 203 at its common terminal 67k. Between contact 67a of switch 67 and local oscillator 356, ½ frequency divider 402 is connected. Divider 402 divides frequencies of signals supplied from local oscillator 356 into ½, and outputs four signals having a phase difference of 90 degrees from each other.

Frequency divider 402 connects to a common terminal of switch 401 at its two output terminals 402c, and contact 401a of switch 401 connects to contact 67a of switch 67, and contact 401b connects to an input terminal of ½ frequency divider 201. Divider 402 outputs four signals having a phase of 0 degree, 90 degrees, 180 degrees and 270 degrees respectively. Signals supplied to divider 201 may have a phase difference of 180 degrees, so that two signals from divider 402 can be used since the two signals have a phase of 90 degrees and a phase of 270 degrees.

In FIG. 9A, switches 403 are connected respectively between two terminals selected from among common terminals 67k of switch 67 and input terminals of mixers 355a and 365a. Switch 403 switches supplying signals from switch 67 to synthesizers 202, 203 to supplying the signals to mixers 355a, 365a.

In the foregoing structure, an operation of the mixer during the reception of TV broadcastings is demonstrated hereinafter. First, the operation in the regular mode is demonstrated.

In the case of receiving UHF band, switch 401 selects contact 401a, and switch 67 selects contact 67a. Then switch 403 selects contact 403a, so that vector synthesizers 202, 203 receive signals of which frequencies are reduced to ½ from those of the original signals supplied from local oscillator 356. Mixer 365 and phase-shifter 365c stay turned-off because they are the mixers for receiving VHF band, and frequency dividers 201, 205 also stay turned-off. Circuits other than those discussed above are turned-on. This structure allows supplying signals having a phase difference of 90 degrees from each other to mixers 355a, 355b. Those signals have been supplied from local oscillator 56 and their frequencies have been divided into ½ by divider 402. Mixers 355a, 355b thus work as the IRM.

Next, in the case of receiving VHF high-band, switch 401 selects contact 401b, and switch 67 selects contact 67b. Then switch 204 selects contact 204a. Switch 403 selects contact 403a, so that ½ frequency divider 402 is connected to ½ frequency divider 201. Since mixer 355 and phase-shifter 355c are exclusively used for receiving UHF band, they are turned off. Divider 205 is also turned off. This structure allows supplying signals having a phase difference of 90 degrees from each other to mixers 365a, 365b. Frequencies of those signals have been divided into ¼ from the original ones supplied from local oscillator 356. Mixers 365a, 365b thus work as the IRM.

In the case of receiving VHF low-band, switch 401 selects contact 401b, and switch 67 selects contact 67c. Then switch 204 selects contact 204b and switch 403 selects contact 403a. Since mixer 355a, 355b and phase-shifter 355c are exclusively used for receiving UHF band, they are turned off. In other words, three ½ frequency dividers 402, 201, 205 are formed between local oscillator 356 and vector synthesizers 202, 203. This structure allows supplying signals having a phase difference of 90 degrees from each other to mixers 365a, 365b. Frequencies of those signals have been divided into ⅛ from the original ones supplied from local oscillator 356. Mixers 365a, 365b thus work as the IRM.

In the case of receiving TV broadcastings in the power-saving mode, there are several points different from the reception in the regular mode: First, during the reception of VHF band, vector synthesizers 202, 203, limiting circuits 206, 207, mixer 355b and phase-shifter 355c stay turned-off. Further, switch 403 selects contact 403b, then oscillating signals from local oscillator 356 are divided their frequencies into ½ by frequency divider 402, which supplies signals having a phase difference of 180 degrees from each other to mixer 355 bypassing synthesizer 202 and limiting circuit 206. Mixer 365a thus works as the DBM.

During the reception of VHF high-band, vector synthesizers 202, 203, limiting circuits 206, 207, mixer 365b and phase-shifter 365c are turned off. Further, switch 403 selects contact 403b, then oscillating signals from local oscillator 356 are divided their frequencies into ¼ by frequency dividers 402b, 201. Divider 201 supplies signals having a phase difference of 180 degrees from each other to mixer 365a bypassing synthesizer 202 and limiting circuit 206. Mixer 365a thus works as the DBM.

During the reception of VHF low-band, vector synthesizers 202, 203, limiting circuits 206, 207, and phase-shifter 365c stay turned off. Further, switch 403 selects contact 403b, then oscillating signals from local oscillator 356 are divided their frequencies into ⅛ by frequency dividers 402b, 201b, 205a.

Divider 205a supplies signals having a phase difference of 180 degrees from each other to mixer 365a bypassing synthesizer 202 and limiting circuit 206. Mixer 365a thus works as the DBM.

The foregoing structures allow the mixer to work as the DBM in the power-saving mode, so that the high-frequency receiver can be expected to consume less power.

On top of that, during the reception in the regular mode, four signals having a phase difference of 90 degrees from each other are supplied to vector synthesizers 202, 203 regardless of frequency bands to be received. When UHF band is received, desirable signals to be received and output signals from synthesizers 202, 203 are mixed by mixers 355a, 355b and 90-degree phase-shifter 355c. Thus the UHF signal receiving section works as the IRM, so that image interference can be reduced even during the reception of UHF broadcastings.

Since the IRM can reduce image interference, single-tuned filter 52 and double-tuned filter 54 can moderate attenuating the signals which cause image interference. Meanwhile, a high-pass filter, which passes signals over UHF band, can be used instead of double-tuned filter 54.

Synthesizing of vectors allows correcting errors possibly found in output signals from dividers 402, 201, and 205, so that signals having accurate phase difference of 90 degrees from each other are obtainable across wide range frequencies. Thus a high-frequency receiver highly resistant to interference during the reception of UHF band is achievable.

FIG. 9B shows relations between the respective circuits and statuses of the switches in each mode during the reception of the respective broadcasting bands. In FIG. 9B, receivable band "VL" stands for VHF low-band, and "VH" stands for VHF high-band. The way of reading the statuses of the switches is the same as that shown in FIG. 6B described in the first embodiment, so that detailed description is omitted here.

Exemplary Embodiment 4

The fourth embodiment uses the IRM for VHF high-band and a harmonic rejection mixer (HRM) for VHF low-band in the circuits of VHF signal receiving section 61 used in the first embodiment.

Figure 10:
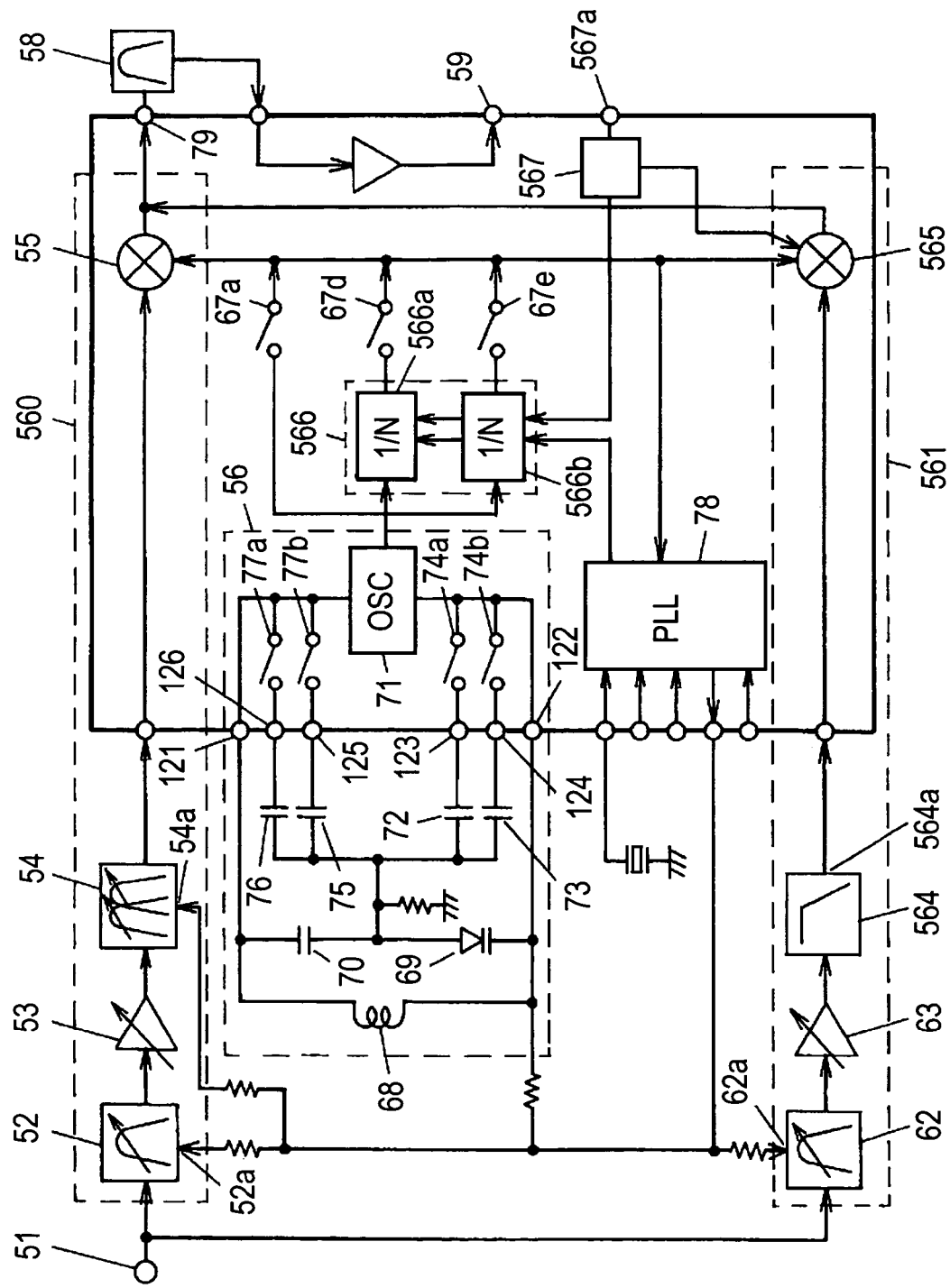
FIG. 10 shows a block diagram illustrating a high-frequency receiver in accordance with a fourth exemplary embodiment of the present invention.

FIG. 10 shows a block diagram of a high-frequency receiver in accordance with the fourth embodiment. In FIG. 10, similar elements to those used in FIG. 2 have the same reference marks, and the descriptions thereof are simplified. In FIG. 10, input terminal 51 receives high-frequency signals having frequencies between 55.25 MHz and 801.25 MHz. UHF signal receiving section 560 is formed of single-tuned filter 52, high-frequency amplifier 53, double-tuned filter 54, and mixer 55.

VHF signal receiving section 561 receives VHF band signals from among the signals supplied to input terminal 51, where the VHF band signals have frequencies ranging from 55.25 MHz to 361.25 MHz. VHF signal receiving section 561 is formed of single-tuned filter 62, high-frequency amplifier 63, low-pass filter 564 and mixer 565 connected in this order.

Low-pass filter 564 receives output signals from high-frequency amplifier 63, and passes VHF band signals having the frequencies not higher than 361.25 MHz.

Mixer 565 connects to output terminal 564a of low-pass filter at its first input terminal, and connects to an output terminal of local oscillator 56 via frequency divider 566 at its second input terminal. Mixer 565 mixes the VHF band signals having undergone low-pass filter 564 with the oscillating signals from local oscillator 56, and converts the mixed signals into intermediate frequency signals (45.75 MHz). The output signals from mixer 565 are supplied to an input terminal of intermediate frequency filter 58 via output terminal 79.

Frequency divider 566 includes frequency divider 566b for VHF low-band signals and divider 566a for VHF high-band signals. Switch 67 selectively switches to or from the output signals supplied from oscillator 56, the output signals supplied from dividers 566a, 566b before those signals are supplied to mixer 565.

Power supply control circuit 567 includes control terminal 567a, which receives output signals from image interference determiner 44 (shown in FIG. 1), so that control circuit 567 turns on or off a part of divider 566 or a part of mixer 565 in response to control signals supplied from determiner 44.

Next, the reception of TV broadcastings by the high-frequency receiver in accordance with the fourth embodiment is described hereinafter. Since the UHF band receiving section is the same as that of the first embodiment, the receptions of VHF high-band and VHF low-band are described here.

Local oscillator 56 oscillates signals having frequencies ranging from 358 MHz to 814 MHz during the reception of VHF high-band, and oscillates signals having frequencies ranging from 404 MHz to 692 MHz during the reception of VHF low-band.

During the reception of VHF high-band, oscillating signals from local oscillator 56 are divided their frequencies by divider 566a before they are supplied to mixer 565, so that intermediate frequency signals of 45.75 MHz are produced. In NTSC broadcasting system, during the reception of VHF low-band, the oscillating signals from oscillator 56 are divided their frequencies into ¼ by divider 566b before those signals are supplied to mixer 565, so that intermediate frequency signals of 45.75 MHz are produced.

Figure 11A:
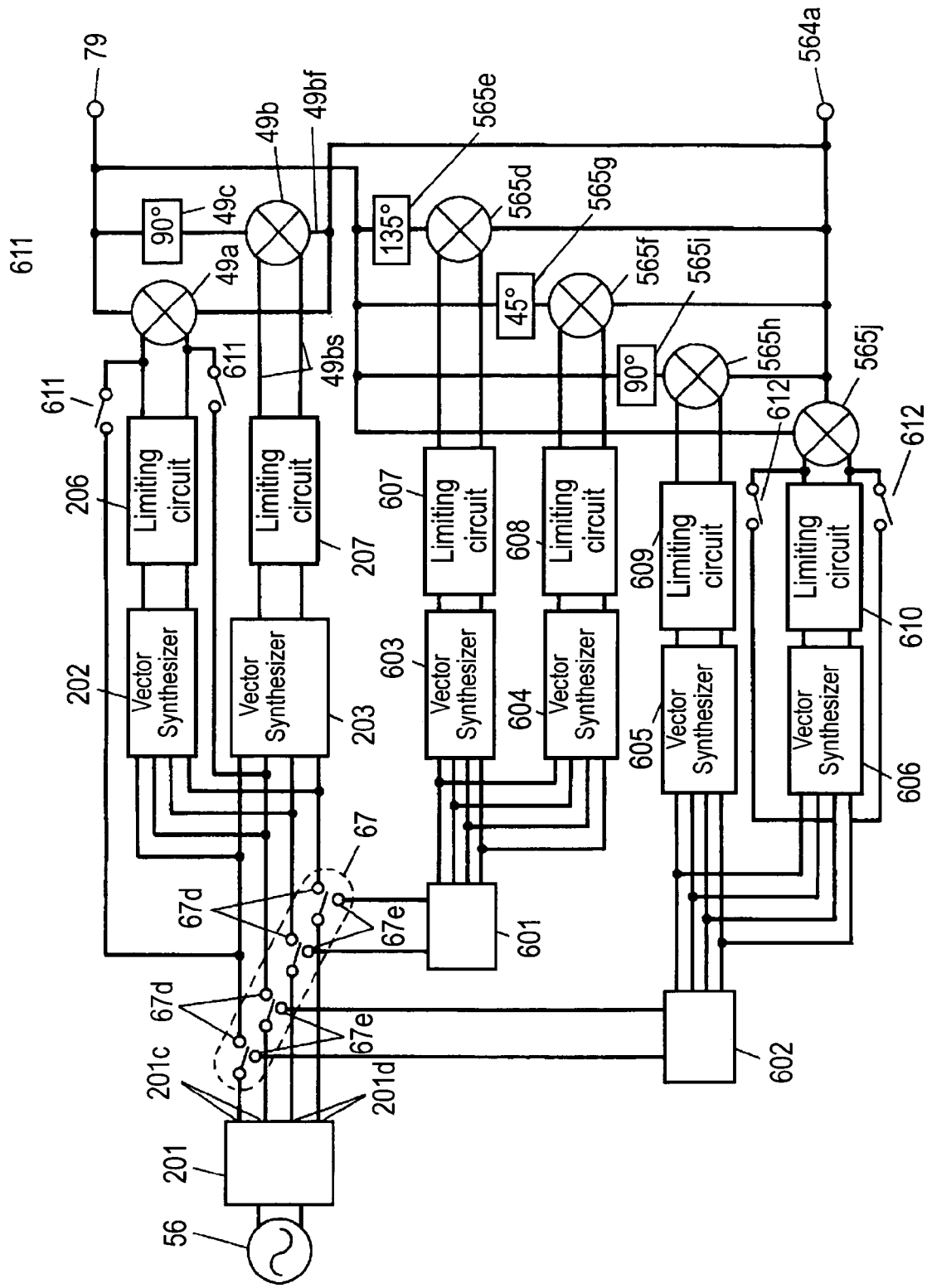
FIG. 11A shows a block diagram detailing a frequency divider and a mixer in accordance with the fourth exemplary embodiment of the present invention.

Next, frequency divider 566 and mixer 565 are described with reference to FIG. 11A, which details divider 566 and mixer 565. (150) In FIG. 11A, elements similar to those in FIG. 5 have the same reference marks, and the descriptions thereof are simplified here. Mixer 565 connects to mixer 49a, mixer 49b connects in parallel to mixer 49a, and 90-degree phase-shifter 49c connects to an output side of mixer 49b. A first input terminal of mixer 49a connects to output terminal 564a of low-pass filter 564, and a second input terminal of mixer 49a receives output signals from limiting circuit 206. On the other hand, first input terminal 49bf of mixer 49b connects to output terminal 564a of low-pass filter 564, and second input terminal 49bs connects to an output terminal of limiting circuit 207.

Common terminal 67k of switch 67 connects to output terminals 201c, 201d of ½ frequency divider 201, and contact 67d of switch 67 connects to vector synthesizers 202, 203.

Contact 67c of switch 67 connects to ½ frequency dividers 601, 602, which divide the frequencies of signals supplied from divider 201 into ½. Divider 201 supplies four signals having a phase difference of 90 degrees from each other. Divider 601 receives signals having a phase difference of 180 degrees from each other via switch 67, where those signals have undergone divider 201. On the other hand, divider 602 receives signals having a phase difference of 180 degrees from each other via switch 67, where those signals have undergone divider 201.

Vector synthesizers 603, 604 receive four signals from divider 601, where these signals have a phase difference of 90 degrees from each other, and synthesizes the vectors of these signals. ½ vector synthesizers 605, 606 receive four signals from divider 602, where these signals have a phase difference of 90 degrees from each other, and synthesizes the vectors of these signals.

Limiting circuit 607, 608, 609, and 610 receive output signals from vector synthesizers 603, 604, 605, and 606 respectively. Mixers 565d, 565f, 565h, and 565j receive output signals from limiting circuits 607, 608, 609, and 610 at their first input terminals respectively, and connect to output terminals 564a at their second input terminals.

Mixer 565d connects to 135-degree phase shifter 565e at its output terminal, mixer 565f connects to 45-degree phase shifter 565g at its output terminal, mixer 565h connects to 90-degree phase shifter 565i at its output terminal. Those four mixers supply signals to output terminal 79.

In this fourth embodiment, switch 611 is provided, so that frequency divider 201 outputs signals straightly to mixer 49a bypassing vector synthesizer 202 and limiting circuit 206.

Switch 612 is provided, so that frequency divider 602 outputs signals straightly to mixer 565j bypassing vector synthesizer 606 and limiting circuit 610.

An operation during the reception of TV broadcastings is demonstrated hereinafter. During the reception of VHF high-band in the regular mode, switch 67 selects contact 67d, and switch 611 is turned off. Further, divider 201, synthesizers 202, 203, and limiting circuits 206, 207 are turned on, while the circuits other than foregoing ones are turned off. This structure allows divider 201 to divide the frequency of local oscillator 56 into ½, then oscillator 56 outputs signals having a phase difference of 90 degrees from each other. Those signals are supplied to mixers 49a, 49b via synthesizers 202, 203 and limiting circuits 206, 207. The mixers thus work as the IRM.

During the reception of VHF low-band, switch 67 selects contact 67e, and switch 612 is turned off. Further, dividers 201, 602, synthesizers 605, 606, and limiting circuits 609, 610, mixers 565h, 565j, and phase shifter 565i are turned on, while the circuits other than foregoing ones are turned off. This structure allows dividers 201, 602 to divide the frequency supplied from local oscillator 56 into ¼, then divider 602 outputs signals having a phase difference of 180 degrees from each other. The signals having a phase difference of 90 degrees from each other are supplied to mixers 565h, 565j via synthesizers 605, 606 and limiting circuits 609, 610. The mixers thus work as the IRM.

An operation during the reception of TV broadcastings in the power-saving mode is demonstrated hereinafter. During the reception of VHF high-band, switch 67 selects contact 67d, and switch 611 is turned on. Further, synthesizers 202, 203, and limiting circuits 206, 207, mixer 49b and phase shifter 49c are turned off. This structure allows divider 201 to divide the frequency supplied from local oscillator 56 into ½, then oscillator 56 outputs signals having a phase difference of 90 degrees from each other straightly to mixer 49d bypassing synthesizer 202 and limiting circuit 206. The mixer thus works as the DBM.

On the other hand, during the reception of VHF low-band, switch 612 is turned on, and vector synthesizers 605, 606, limiting circuits 609, 610, mixer 565h and phase shifter 565i are turned off. This structure allows divider 602b to output signals straightly to mixer 565j bypassing synthesizer 606 and limiting circuit 610, so that the mixer works as the DBM.

On top of that, during the reception of VHF low-band, the mode is switched to a high-quality mode where the mixer works as the HRM (harmonic rejection mixer). In the high-quality mode, switch 67 selects contact 67e, and switch 612 is turned off. Further, synthesizers 202, 203, and limiting circuits 206, 207, mixers 49a, 49b, and phase shifter 49c are turned off, while the circuits other than foregoing ones are turned on. This structure allows dividers 201, 601, 201, 602 to divide the frequencies of oscillating signals supplied from local oscillator 56 into ¼, then dividers 601, 602 respectively output four signals having a phase difference of 45 degrees from each other. The signals are supplied to mixers 565d, 565f, 565h, 565j via synthesizers 603, 604, 605, 606 and limiting circuits 607, 608, 609, 610. The mixers thus work as the HRM.

As discussed above, during the reception of VHF low-band, the mixer can select the way of working from among the HRM, IRM, and DBM. During the reception of VHF high-band, the mixer can select the way of working between the IRM and DBM. This mechanism allows the mixer to work as the DBM when no image interference exists, so that the high-frequency receiver can be expected to consume less power, and the portable device using the same receiver also consumes less power.

Figure 12:
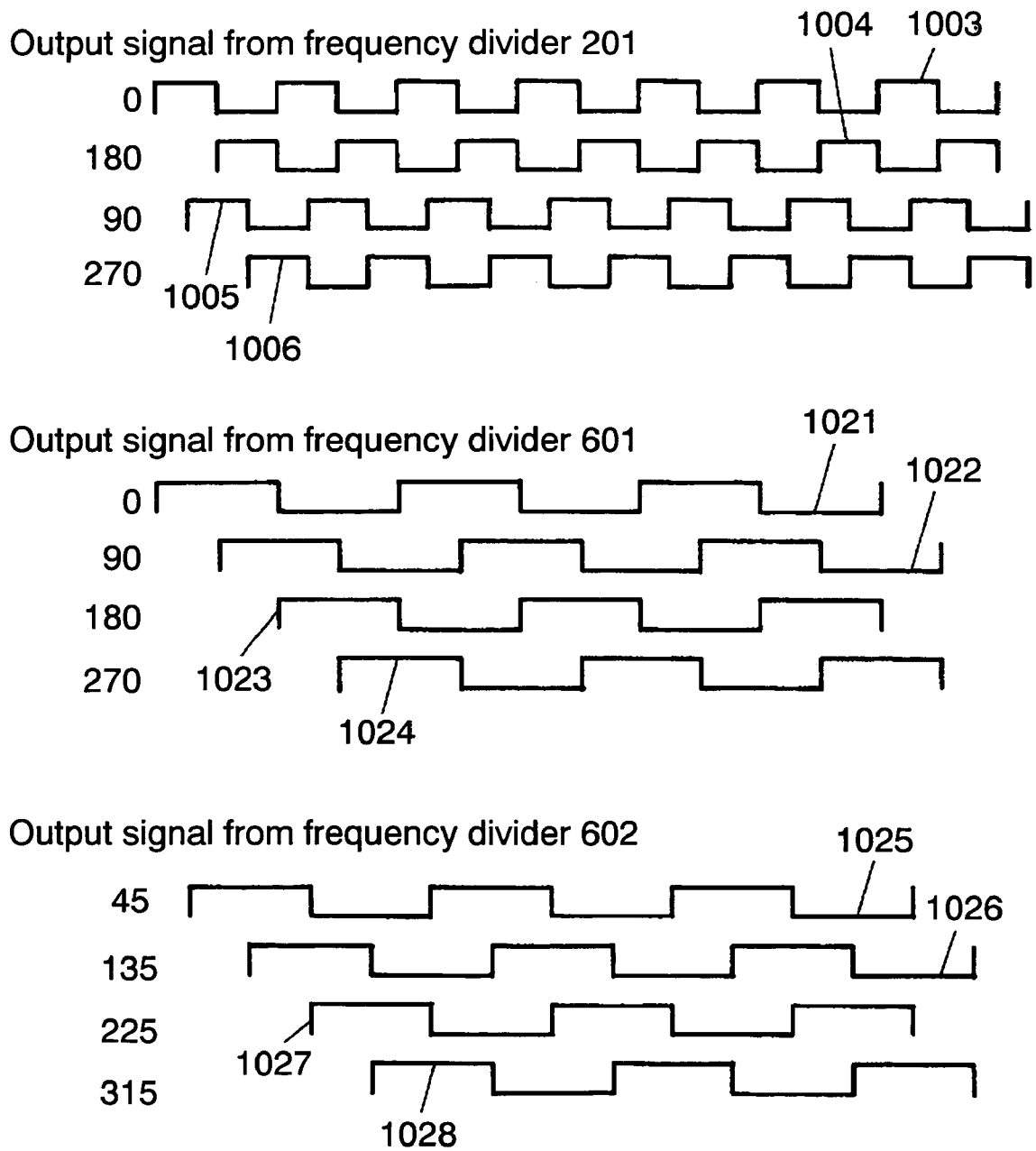
FIG. 12 shows timing charts of signals in accordance with the fourth exemplary embodiment of the present invention.

An operation of frequency dividers 201, 601, 602 and vector synthesizers 202, 203, 603, 604, 605, 606 in accordance with the fourth embodiment is demonstrated hereinafter with reference to FIG. 12, which shows the timing charts of dividers 601, 602. Elements similar to those used in FIG. 6 have the same reference marks, and the descriptions thereof are simplified here.

Frequency divider 201 outputs signals 1003, 1004, 1005, and 1006. Signal 1003 has a phase of 0 degree, and signals 1004, 1005, 1006 has a phase difference of 180, 90, and 270 degrees respectively from the phase of signal 1003.

Frequency divider 601 outputs signals 1021, 1022, 1023, and 1024. Signal 1021 has a phase of 0 degree, which is the same as that of signal 1003, so that those two signals has a phase difference of 0 degree. Signals 1022, 1023, 1024 has a phase difference of 90, 180, and 270 degrees respectively from the phase of signal 1021.

Frequency divider 602 outputs signals 1025, 1026, 1027 and 1028. Signal 1025 has a phase difference of 45 degrees from signals 1003 and 1021.

Phases of signals 1026, 1027, and 1028 are shifted 135, 225, and 315 degrees from each other.

The structure discussed above allows dividing the oscillating signals supplied from local oscillator 56 into given frequencies, and allows synthesizers 603, 604, 605 and 606 to output eight signals 1021, 1025, 1022, 1026, 1023, 1027, 1024 and 1028 having a phase difference of 45 degrees from each other. In other words, vector synthesizer 603 synthesizes output signal 1022 having a phase of 90 degrees and output signal 1023 having a phase of 180 degrees, thereby producing an output signal having a phase of 135 degrees. It also synthesizes output signal 1021 having a phase of 0 degree and output signal 1024 having a phase of 270 degrees, thereby producing an output signal having a phase of 315 degrees.

On the other hand, vector synthesizer 604 synthesizes output signal 1021 having a phase of 0 degree and output signal 1022 having a phase of 90 degrees, thereby producing an output signal having a phase of 45 degrees. It also synthesizes output signal 1023 having a phase of 180 degrees and output signal 1024 having a phase of 270 degrees, thereby producing an output signal having a phase of 225 degrees.

Vector synthesizer 605 synthesizes output signal 1025 having a phase of 45 degrees and output signal 1026 having a phase of 135 degrees, thereby producing an output signal having a phase of 90 degrees. It also synthesizes output signal 1027 having a phase of 225 degrees and output signal 1028 having a phase of 315 degrees, thereby producing an output signal having a phase of 270 degrees. Vector synthesizer 606 synthesizes output signal 1025 having a phase of 45 degrees and output signal 1028 having a phase of 315 degrees, thereby producing an output signal having a phase of 0 degree. It also synthesizes output signal 1026 having a phase of 135 degrees and output signal 1027 having a phase of 225 degrees, thereby producing an output signal having a phase of 180 degrees.

The structure discussed above allows frequency dividers 201, 601 and 602 to have a function of frequency divider which divides a frequency of a signal having a given frequency and also have a function of phase-shifter. Mixers 49a and 49b thus form the IRM during the reception of VHF high-band, and mixers 565d, 565f, 565h and 565j form the HRM during the reception of VHF low-band. As a result, image interference can be reduced during the reception of VHF high-band, and higher local harmonic interference can be reduced during the reception of VHF low-band. This reduction of higher local harmonic interference is disclosed by the same inventors in Japanese Patent Unexamined Publication No. 2004-179841. Meanwhile the HRM in accordance with the fourth embodiment is formed of four mixers, so that interference due to harmonics of not higher than five times of the output signal from divider 566b can be reduced during the reception of VHF high-band.

In the receiver equipped with a local oscillator and a frequency divider, a divider for VHF low-band has a smaller dividing rate than a divider for VHF high-band, so that the IRM can be formed during the reception of VHF high-band, and the HRM can be formed during the reception of VHF low-band where higher-order harmonic interference can be possibly generated.

Since the IRM and the HRM can reduce image interference and local harmonic interference, low-pass filter 564 can use a low-pass filter. On top of that, forming of the HRM for VHF low-band allows reducing adverse influence from VHF high-band signals which interferes with the reception together with local harmonics. Thus a tuned filter is not needed for VHF low-band, and VHF low-pass filter 564 proper to the receiver can work enough, so that the cost of the high-frequency receiver can be reduced. Since VHF low-pass filter 564 is proper to the receiver, desirable signals can undergo this filter with less passing loss. As a result, a high-frequency receiver with better C/N is achievable.

In this fourth embodiment, ½ frequency dividers 201, 601, and 602 are formed of flip-flop circuits, which simplify the circuit structure, so that use of an integrated circuit will increase a packing density.

Since vector synthesizers 202, 203, 603, 604, 605 and 606 are provided, signals having different phases can be accurately obtained even if errors are produced in the output signals from dividers 201, 601 and 602. Signals having accurate phases are thus obtainable across the wide-band frequencies such as VHF band, so that image interference and local harmonics interference can be steadily suppressed.

OSC 71, switches 74, 77, frequency divider 566, mixers 55, 565 and PLL circuit 78 are packaged into one integrated circuit, so that the high-frequency receiver can be downsized.

FIG. 11B shows relations between operations of the respective circuits and statuses of the switches in accordance with the fourth embodiment. In FIG. 11B, receivable band "VL" stands for VHF low-band, and "VH" stands for VHF high-band. The way of reading the statuses of the switches shown in FIG. 11B is the same as that shown in FIG. 6B described in the first embodiment, so that detailed description is omitted here.

Exemplary Embodiment 5

The high-frequency receiver in accordance with the fifth embodiment works as the HRM during the reception of VHF low-band, while it works as the IRM during the reception of VHF high-band using parts of the HRM. Thus the receiver can share parts of its mixing circuits, so that the circuits can be downsized and the cost thereof can be lowered.

Figure 13A:
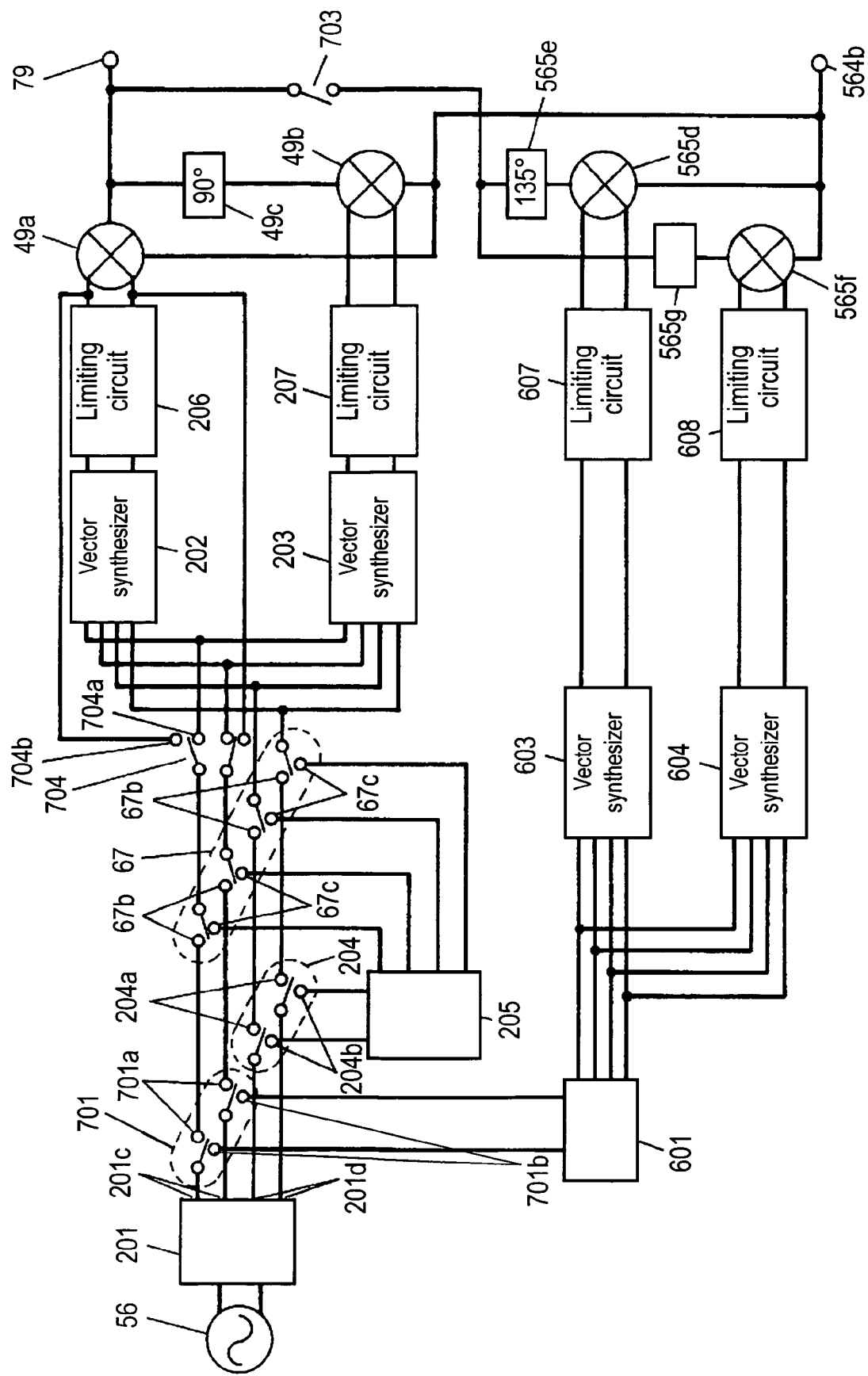
FIG. 13A shows a block diagram detailing a frequency divider and a mixer in accordance with a fifth exemplary embodiment of the present invention.
Figure 14:
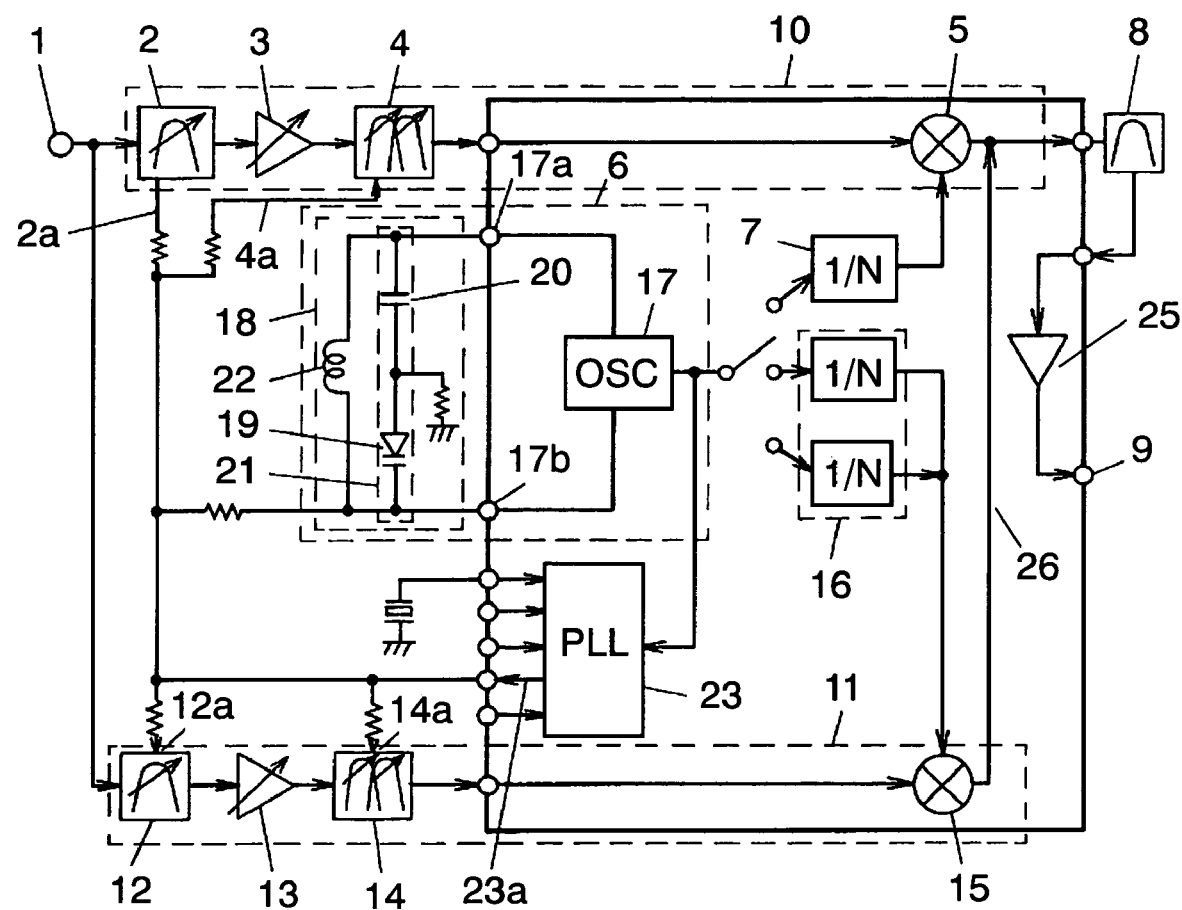
FIG. 14 shows a block diagram illustrating a conventional high-frequency receiver.

FIG. 13A shows a block diagram illustrating frequency dividers and mixers in accordance with the fifth embodiment. Elements similar to those used in FIGS. 5, 9, and 10 have the same reference marks, and the descriptions thereof are simplified here.

In this fifth embodiment, switch 701 is connected between output 201c of ½ frequency divider 201 and contact 67b of switch 67 with respect to the IRM shown in FIG. 7A described in the second embodiment. Switch 701 receives an output from divider 201 at its common terminal. Contact 701a of switch 701 connects to contact 67b of switch 67.

Switch 208 connected between limiting circuit 206 and mixer 49a is replaced with switch 704, which is specifically disposed between common terminal 67k of switch 67 and mixer 49a. Dividers 201, 205 supply signals to mixers 49a, 49b via vector synthesizers 202, 203, and limiting circuits 206 and 207, while an output from contacts 701b of switch 701 is supplied to ½ frequency divider 601.

Both in the regular mode and the power-saving mode, the receptions of VHF high-band and low-band are substantially the same as those in the second embodiment, only switch 704 selects contact 704a in the regular mode and selects contact 704b in the power-saving mode.

The structure discussed above allows mixers 49a, 49b to work as the IRM in the regular mode, and to work as the DBM in the power-saving mode, so that the portable receiver consuming less power is achievable.

On top of that, the high-quality mode is available in the fifth embodiment as it is available in the fourth embodiment. During the reception of VHF low-band, switch 701 selects contact 701b, switch 204 selects contact 204b, switch 67 selects contact 67c, and switch 704 selects contact 704a. This structure allows frequency signals supplied from local oscillator 56 to be divided into ¼ by dividers 201, 205, and dividers 201, 601, so that dividers 205 and 601 supply signals having a phase difference of 90 degrees from each other to mixers 565d, 565f via vector synthesizers 603, 604 and limiting circuits 607, 608. The mixers thus work as the HRM.

FIG. 13B shows relations between operations of the respective circuits and statuses of the switches in accordance with the fifth embodiment. The way of reading the statuses of the switches shown in FIG. 13B is the same as that shown in FIG. 6B described in the first embodiment, so that detailed description is omitted here.

As discussed above, the high-frequency receiver and the portable device using the same receiver in accordance with the fifth embodiment can work as the HRM during the reception of VHF low-band, while they can work as the IRM during the reception of VHF high-band, so that mixer 49 can be commonly used for the entire VHF band. As a result, the circuits become smaller, and the high-frequency receiver can be downsized.

INDUSTRIAL APPLICABILITY

A high-frequency receiver and a portable device using the same receiver of the present invention changes the structure of their mixers in response to existence of image interference signals, so that less power consumption can be expected. The receiver is thus useful in an electronic tuner for receiving TV broadcastings carrying wide-band signals, so that the receiver is highly applicable to the industrial use.

What is claimed is:

1. A high-frequency receiver comprising:
   (a) a high-frequency signal input terminal for receiving high-frequency signals;
   (b) a tuned filter coupled to the input terminal;
   (c) a first mixer including a double balance mixer circuit having a first input terminal which receives an output signal from the tuned filter and a second input terminal which receives an output signal from a local oscillator;
   (d) an output terminal for receiving an output signal from the first mixer;
   (e) a second mixer connected between the tuned filter and the output terminal, and having an image rejection mixer circuit which receives an output from the local oscillator;
   (f) a power supply control circuit coupled to the image rejection mixer circuit and controlling a power supply which powers the image rejection mixer circuit;
   (g) an image interference determiner coupled to an input side of the power supply control circuit; and
   (h) a phase locked loop (PLL) circuit coupled to the local oscillator,
   wherein an input terminal of the image interference determiner receives an output signal of a position data obtaining means;
   the image interference determiner determines, in response to a position data obtained from the position data obtaining means, whether or not a received channel involves image interference so as to determine whether or not image interference exists at a present position with respect to a channel desirable to be received, and
   the power supply control circuit stops the supply of power to the first mixer so as to allow the first mixer to work as the double balance mixer when the determiner determines no image interference exists.

2. The high-frequency receiver of claim 1, wherein at least one of the mixers that include the image rejection mixer circuits shares a mixer which includes the double balance mixer circuit.

3. The high-frequency receiver of claim 1, wherein the image rejection mixer circuit includes:
   a local oscillator for outputting signals having a phase difference of 180 degrees from each other;
   a first frequency divider coupled to an output of the local oscillator and outputting four signals having a phase difference of 90 degrees from each other;
   a first vector synthesizer for receiving an output signal from the first divider, and synthesizing the output signals supplied from the first divider to output signals having a phase difference of 180 degrees from each other;
   a first mixer for receiving an output from the first synthesizer at its first input terminal, and receiving the high-frequency signal at its second input terminal;
   a second vector synthesizer for receiving the output signal from the first divider and synthesizing the output signals supplied from the first divider to output a signal having a phase difference of 90 degrees from the output signal supplied from the first vector synthesizer;
   a second mixer for receiving the output signal from the second vector synthesizer at its first input terminal, and receiving the high-frequency signal at its second input terminal;
   a phase shifter connected between an output signal and an output terminal either one of the first mixer and the second mixer; and
   a mixer input switching means provided between either one of the first and second dividers and either one of the first and second mixers such that the either one of the divider outputs a signal to either one of the mixers bypassing either one of the first and second vector synthesizers,
   wherein when the image interference determiner determines that image interference happens in a received channel, the switching means supplies the output signal from the divider to the first mixer bypassing the first vector synthesizer, and the power supply control circuit turns off at least one of the first vector synthesizer and the first mixer.

4. The high-frequency receiver of claim 1 further comprising a frequency switching means connected between a first frequency divider and a first vector synthesizer, and between the first frequency divider and a second vector synthesizer, wherein the frequency synthesizer includes:

a second frequency divider for receiving two output signals having a phase difference of 180 degrees from each other supplied from the first frequency divider; and a divider switching means for selectively supplying an output signal from the first divider and the second divider to the first vector synthesizer and the second vector synthesizer, wherein the second frequency divider outputs four signals having a phase difference of 90 degrees from each other, and the high-frequency signal includes a first frequency band broadcasting signal and a second frequency band broadcasting signal of which frequency is higher than the first frequency band, and the divider switching means supplies an output from the second divider to the first and the second mixers during a reception of the first frequency band broadcasting signal, and the divider switching means supplies an output from the first divider to the first and the second mixers and also turns off the second divider during a reception of the second frequency band broadcasting signal.

5. A portable device comprising: a high-frequency receiver including:

(a) a high-frequency signal input terminal for receiving high-frequency signals;

(b) a tuned filter coupled to the input terminal;

(c) a first mixer including a double balance mixer circuit having a first input terminal which receives an output signal from the tuned filter and a second input terminal which receives an output signal from a local oscillator;

(d) an output terminal for receiving an output signal from the first mixer;

(e) a second mixer connected between the tuned filter and the output terminal, and having an image rejection mixer circuit which receives an output from the local oscillator;

(f) a power supply control circuit coupled to the image rejection mixer circuit and controlling a power supply which powers the image rejection mixer circuit;

(g) an image interference determiner coupled to an input side of the power supply control circuit; and (h) a phase locked loop (PLL) circuit coupled to the local oscillator, wherein the image interference determiner determines whether or not image interference exists at a present position with respect to a channel desirable to be received, and the power supply control circuit stops the supply of power to the first mixer so as to allow the first mixer to work as the double balance mixer when the determiner determines no image interference exists, a position data obtaining means coupled to an antenna and obtaining data of a present position;

a signal processor for receiving an output from the high-frequency receiver; and a display and an audio output device to which an output signal is supplied from the signal processor, wherein the image interference determiner receives an output signal from the position data obtaining means at its first input terminal, and connects to a memory at its second input terminal, and the memory stores a plurality of receivable frequencies corresponding to the position data, wherein the image interference determiner determines, in response to the position data obtained from the position data obtaining means, whether or not a received channel involves image interference, and when the determiner determines no image interference happens in the received channel, the determiner turns off an image rejection mixer circuits of the mixer, and switches the mixer to a double balance mixer circuit.

* * * * *